United States Patent
Abe et al.

(10) Patent No.: US 8,450,706 B2
(45) Date of Patent: May 28, 2013

(54) EXTREME ULTRAVIOLET LIGHT SOURCE APPARATUS

(75) Inventors: Tamotsu Abe, Hiratsuka (JP); Hiroshi Someya, Hiratsuka (JP); Takashi Suganuma, Hiratsuka (JP); Takayuki Yabu, Hiratsuka (JP)

(73) Assignee: Gigaphoton Inc., Tochigi (JP)

( * ) Notice: Subject to any disclaimer, the term of this patent is extended or adjusted under 35 U.S.C. 154(b) by 33 days.

(21) Appl. No.: 12/453,058

(22) Filed: Apr. 28, 2009

(65) Prior Publication Data

US 2009/0272919 A1    Nov. 5, 2009

(30) Foreign Application Priority Data

Apr. 20, 2007   (JP) .................. 2007-111704

(51) Int. Cl.
 *G21F 5/02*         (2006.01)
(52) U.S. Cl.
 USPC ............... 250/496.1; 250/493.1; 250/494.1; 250/423 R; 250/424
(58) Field of Classification Search
 USPC .......... 250/493.1, 494.1, 495.1, 496.1, 498.1, 250/423 R, 424
 See application file for complete search history.

(56) References Cited

U.S. PATENT DOCUMENTS 7,164,144 B2 * 1/2007 Partlo et al. ............... 250/504 R
7,368,741 B2 * 5/2008 Melnychuk et al. ...... 250/504 R

FOREIGN PATENT DOCUMENTS

JP    09-320794     12/1997
JP    2005-268358   9/2005
WO    WO 99/63790   12/1999

OTHER PUBLICATIONS

Japanese Office Action, w/ partial English translation thereof, issued in Japanese Patent Application No. 2007-111704, dated Dec. 13, 2011.

* cited by examiner

*Primary Examiner* — Robert Kim
*Assistant Examiner* — Hanway Chang
(74) *Attorney, Agent, or Firm* — McDermott Will & Emery LLP

(57) ABSTRACT

An extreme ultraviolet light source apparatus in which only particles having a high transmittance for EUV light adhere to an EUV collector mirror even if fast ions emitted from plasma collide with a structural member in a vacuum chamber, and thereby, the reflectance thereof is not easily degraded. The apparatus includes: a vacuum chamber; a target supply unit for supplying a target to a predetermined position in the vacuum chamber; a driver laser for applying a laser beam to the target to generate the plasma; a collector mirror for collecting and outputting extreme ultraviolet light emitted from the plasma; a collector mirror holder for supporting the collector mirror; and a shielding member formed of a material having a high transmittance for the extreme ultraviolet light, for shielding the structural member such as the collector mirror holder from the ions generated from the plasma.

16 Claims, 23 Drawing Sheets

SPUTTER RATE OF Si

SPUTTER RATE OF Au

EXTREME ULTRAVIOLET LIGHT SOURCE APPARATUS

BACKGROUND OF THE INVENTION

1. Field of the Invention

The present invention relates to an extreme ultraviolet (EUV) light source apparatus to be used as a light source of exposure equipment.

2. Description of a Related Art

Recent years, as semiconductor processes become finer, photolithography has been making rapid progress to finer fabrication. In the next generation, micro-fabrication at 60 nm through 45 nm, further, micro-fabrication at 32 nm and beyond will be required. Accordingly, in order to fulfill the requirement for micro-fabrication at 32 nm and beyond, for example, exposure equipment is expected to be developed by combining an extreme ultraviolet (EUV) light source generating EUV light having a wavelength of about 13 nm and a reduced projection reflective system.

As the EUV light source, there are three kinds of light sources, which include an LPP (laser produced plasma) light source using plasma generated by applying a laser beam to a target, a DPP (discharge produced plasma) light source using plasma generated by discharge, and an SR (synchrotron radiation) light source using orbital radiation. Among them, the LPP light source has advantages that extremely high intensity close to black body radiation can be obtained because plasma density can be considerably made larger, that the light emission of only the necessary waveband can be performed by selecting the target material, and that an extremely large collection solid angle from $2\pi$ steradian to $4\pi$ steradian can be ensured because it is a point light source having substantially isotropic angle distribution and there is no structural member surrounding the light source such as electrodes. Therefore, the LPP light source is considered to be predominant as a light source for EUV lithography, which requires power of 100 W or more.

Here, a principle of generating the EUV light according to an LPP system will be described. By applying a laser beam to a target material supplied in a vacuum chamber, the target material is excited and turned into plasma. Various wavelength components including the EUV light are emitted from the plasma. Then, by using a EUV collector mirror reflecting selectively a desired wavelength component (for example, a component having the wavelength of 13.5 nm), the EUV light is reflected and collected, and outputted to an exposure unit.

In such an LPP type EUV light source apparatus, the influence of ions and neutral particles emitted from the plasma at the time of generating the plasma by applying the laser beam to the target particularly has been problematic. Especially, the influence of the ions and neutral particles emitted from the plasma upon the EUV collector mirror is problematic because the EUV collector mirror is located near the plasma. The scattered materials from the plasma including the ions and the neutral particles and remains of the target material are called debris.

Japanese Patent Application Publication JP-P2005-268358A discloses a method of removing deposited materials such as debris emitted from the plasma and adhered to the surface of the collector mirror, of which reflectance is degraded, by applying an ion beam to the collector mirror in a state where a vacuum is kept in a vacuum chamber, in order to reuse the collector mirror.

When high density plasma is generated by applying the laser beam to the target, ions are accelerated and emitted as fast ions from the high density plasma. The energy of the fast ions reaches up to ten and several keV. The fast ions collide with structural member including at least one of the collector mirror holder and the target supply nozzle provided in the vacuum chamber in order to generate the extreme ultraviolet light, an inner wall of the vacuum chamber, and so on. And particles emitted from the structural member caused by the collision adhere to the surface of the EUV collector mirror after moving in the vacuum chamber. In that case, when the EUV light transmittance of atoms constituting the adhered particles is low, the reflectance of the EUV collector mirror will be abruptly degraded. The structural member, such as the collector mirror holder, the target supply nozzle, or the inner wall of the vacuum chamber, is generally made of stainless steel in many cases. When the fast ions collide with the structural member made of stainless steel, particles including iron (Fe), nickel (Ni), chromium (Cr), etc. will be emitted. The particles move within the chamber and some of them adhere to the EUV collector mirror. Since atoms such as iron (Fe), nickel (Ni), and chromium (Cr) have a low transmittance for the EUV light, the reflectance of the EUV collector mirror is abruptly degraded.

The EUV collector mirror is required to have high surface flatness of about 0.2 nm (rms), for example, in order to maintain high reflectance, and therefore, the EUV collector mirror is very expensive. Accordingly, longer life of the EUV collector mirror is particularly desired in view of reduction in operation cost of the exposure equipment, reduction in maintenance time, and so on. Thus, the fast debris such as the ions and neutral particles emitted from the plasma collide with the structural member within the vacuum chamber, and thereby, the particles emitted from the structural member and including atoms having a low transmittance for the EUV light, move in the vacuum chamber, adhere to the EUV collector mirror, and reduce the reflectance of the EUV collector mirror. Such problems as mentioned above have been arisen, and resolution of the problems has become a subject.

SUMMARY OF THE INVENTION

The present invention has been achieved in view of the above circumstances. The purpose of the present invention is to provide an extreme ultraviolet light source apparatus in which, even if fast ions emitted from plasma collide with a structural member, particles including a material having a low transmittance for EUV light are prevented from scattering and adhering to a collector mirror, and thereby, reflectance of the collector mirror is not easily degraded and the collector mirror can have a long life.

In order to accomplish the purpose mentioned above, the extreme ultraviolet light source apparatus according to one aspect of the present invention is an apparatus for generating extreme ultraviolet light by applying a laser beam to a target, and the apparatus includes: a vacuum chamber in which the extreme ultraviolet light is generated; a target supply unit for supplying the target to a predetermined position in the vacuum chamber; a driver laser for applying the laser beam in pulse operation to the target supplied by the target supply unit to generate plasma; a collector mirror arranged in the vacuum chamber and having a multilayer film in a reflection surface thereof, for collecting and outputting the extreme ultraviolet light emitted from the plasma; a collector mirror holder for supporting the collector mirror in the vacuum chamber; and a shielding member arranged in the vacuum chamber, for shielding a structural member from ions generated from the plasma, the structural member including at least one of the collector mirror holder, the target supply unit, and an inner wall of the vacuum chamber, and being formed of a first material, and the shielding member being formed of a second material having a higher transmittance for the extreme ultraviolet light than that of the first material.

According to the one aspect of the present invention, by shielding the structural member in the vacuum chamber with the shielding member including the material having a high transmittance for the EUV light, even if the fast ions generated from the plasma collide with the shielding member, particles of the material having the high transmittance for the EUV light are emitted out of the shielding member by the collision and adhere to the surface of the collector mirror. Therefore, the reflectance of the EUV collector mirror is not easily degraded and the EUV collector mirror can be used for a long time. As a result, it becomes possible to raise the operating ratio of the extreme ultraviolet light source apparatus to reduce the operation cost of the apparatus.

DESCRIPTION OF THE PREFERRED EMBODIMENTS

Figure 1:
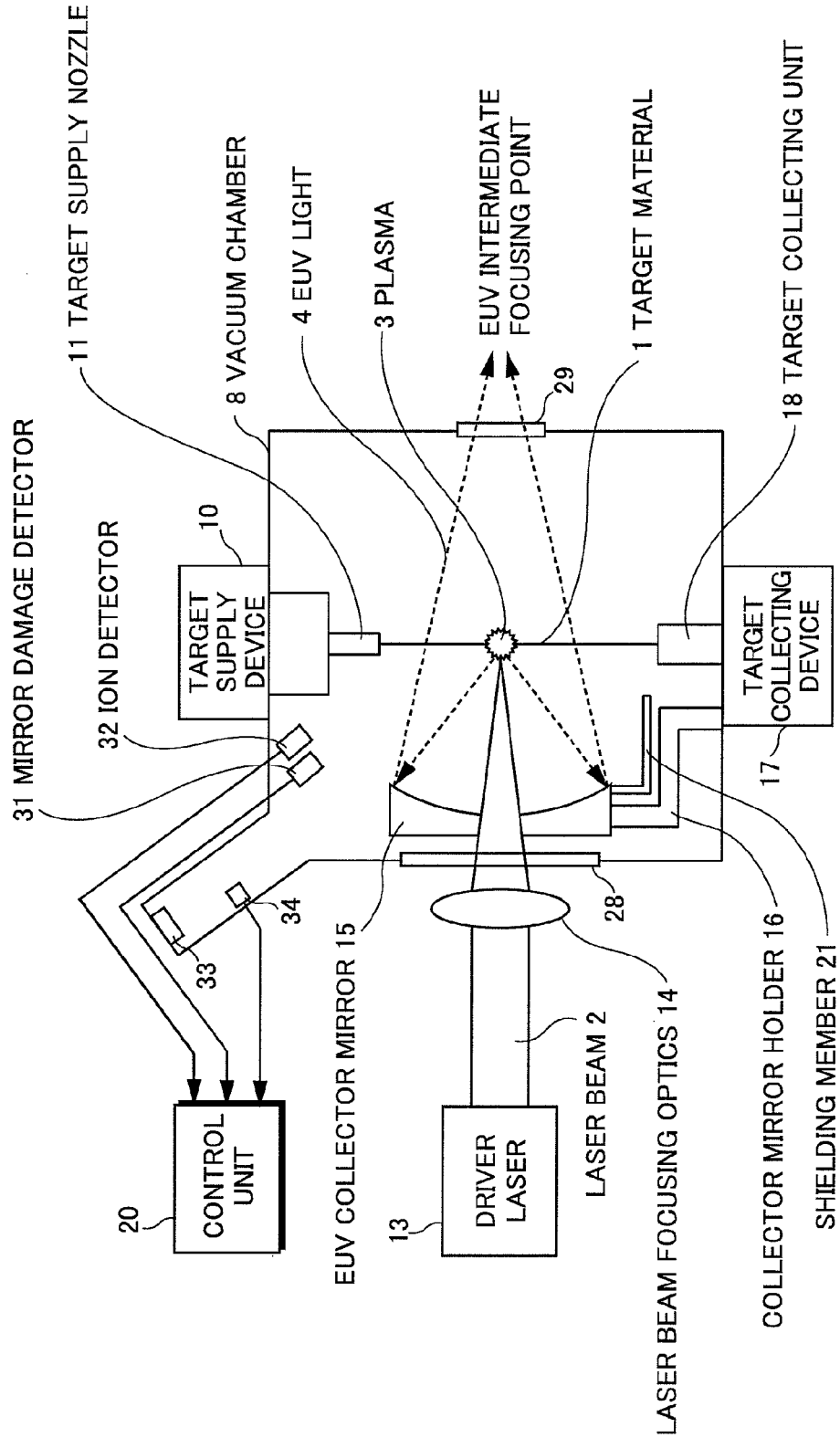
FIG. 1 is a conceptual side view illustrating an EUV light source apparatus according to a first embodiment of the present invention.

Hereinafter, preferred embodiments of the present invention will be described in detail by referring to the drawings. The same reference numerals are assigned to the same component elements and the description thereof will be omitted.

FIG. 1 is a conceptual side view illustrating an EUV light source apparatus according to a first embodiment of the present invention. The EUV light source apparatus according to the embodiment adopts a laser produced plasma (LPP) system of generating EUV light by applying a laser beam to a target material to be excited.

As illustrated in FIG. 1, the EUV light source apparatus includes: a vacuum chamber 8 in which the EUV light is generated; a target supply device 10 for supplying a target material 1; a driver laser 13 for generating an excitation laser beam 2 to be applied to the target material 1; laser beam focusing optics 14 for focusing the excitation laser beam 2 generated by the driver laser 13; an EUV collector mirror 15 for collecting and outputting the EUV light 4 emitted from plasma 3 generated by applying the excitation laser beam 2 to the target material 1; a collector mirror holder 16 for supporting the EUV collector mirror 15 in the vacuum chamber 8; a target collecting device 17 for collecting the target material 1 which has not been used; and a control part 20 for controlling the whole EUV light source apparatus.

Further, the EUV light source apparatus has a shielding member 21 that shields a surface of a structural member including the collector mirror holder 16, or the like, existing in the vacuum chamber 8. Debris including fast ions and fast neutral particles emitted from the plasma 3 cuts out particles from the structural member such as the collector mirror holder 16 existing in the vacuum chamber 8 (in the present application, this phenomena is called "sputtering"), and the cut-out particles scatter. The scattered particles deposit on a mirror surface of the EUV collector mirror 15 to degrade a reflectance of the EUV collector mirror 15. In order to prevent the reflectance from being degraded, the shielding member 21 is provided. The shielding member 21 will be described in detail later.

The vacuum chamber 8 is provided with an introducing window 28 that introduces the excitation laser beam 2, and a conducting window 29 that passes the EUV light emitted from the plasma to an exposure unit. The target supply device 10 has a target supply unit that supplies the target material 1 to the inside of the vacuum chamber 8. In the case where a liquid target is used, a target supply nozzle 11 is used as the target supply unit. The target supply nozzle 11 supplies the target material 1 to a predetermined position within the vacuum chamber 8. As mentioned above, the case where the liquid target is used has been described as an example, but a solid target can also be used.

Figure 10:
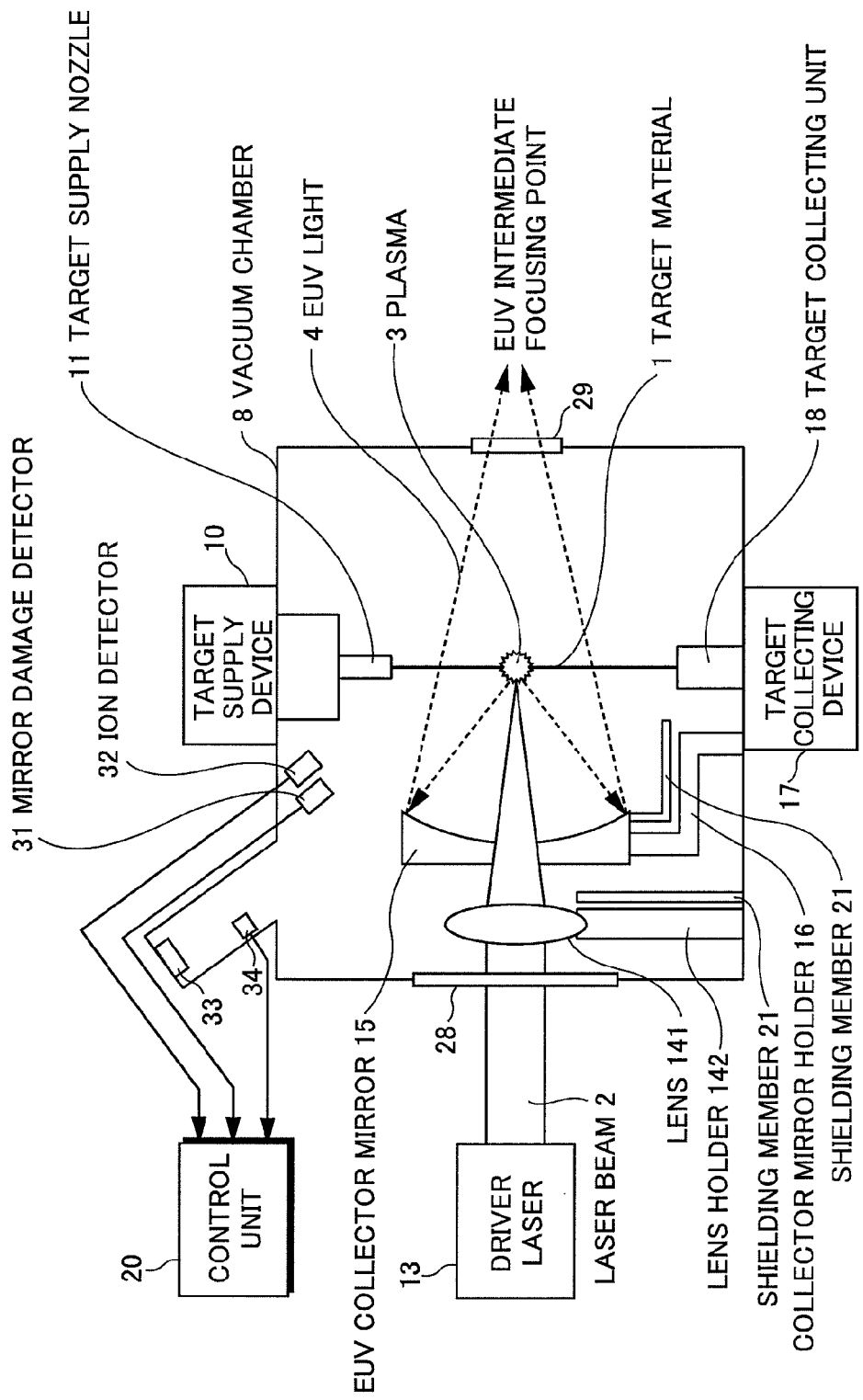
FIG. 10 is a conceptual side view illustrating an EUV light source apparatus according to a sixth embodiment of the present invention.

The driver laser 13 is a laser beam source capable of pulse oscillation at a high repetition frequency (for example, the pulse width is within a range from about several nanoseconds to several tens of nanoseconds, and the repetition frequency is within a range from about 1 kHz to about 100 kHz). The laser beam focusing optics 14 includes at least one lens and/or at least one mirror. The laser beam focusing optics 14 may be located outside the vacuum chamber 8, as illustrated in FIG. 1, or may be located inside the vacuum chamber 8, as illustrated in FIG. 10. The laser beam 2 focused by the laser beam focusing optics 14 is applied to the target material 1 supplied by the target supply device 10 at the predetermined position inside the vacuum chamber 8, and thereby, a part of the target material 1 is excited and turned into plasma, and various wavelength components are radiated from an emission point thereof. Here, the emission point refers to the position where the plasma 3 is generated.

The EUV collector mirror 15 is collecting optics that selectively reflects a predetermined wavelength component (for example, the EUV light having a wavelength near 13.55 nm) from among the various wavelength components emitted from the plasma 3, so as to collect the predetermined wavelength component. The EUV collector mirror 15 has a concave reflecting surface on which a multilayer film of molybdenum (Mo) and silicon (Si) is formed for selectively reflecting the EUV light having a wavelength near 13.5 nm, for example. In FIG. 1, the EUV light is reflected rightward by the EUV collector mirror 15 and focused at an EUV intermediate focusing point, then the EUV light is outputted to the exposure unit.

The target collecting device 17 is located at a position facing the target supply device 10 with the emission point in between. The target collecting device 17 has a target collecting unit 18 in the vacuum chamber 8, and collects a target that has not been turned into the plasma. The collected target may be returned again to the target supply device 10, and circulated for reuse.

Furthermore, the EUV light source apparatus includes a mirror damage detector 31 for estimating the extent of damage to the multilayer film of the EUV collector mirror 15 caused by the particles emitted from the plasma 3, an ion detector 32 for detecting an amount of the ions emitted from the plasma 3, and a multilayer film mirror 33 and an EUV photodetector 34 for detecting the intensity of the EUV light in the emission point without intermediation of the EUV collector mirror 15.

The mirror damage detector 31 is constituted by QCM (quartz crystal microbalance), for example. The QCM can measure a thickness of a sample film made of gold (Au) or the like formed on the sensor surface with an accuracy of an angstrom level in real time based on change of the resonance frequency of the crystal. If the correlation function between the extent of damage of the gold film and the extent of damage of the EUV collector mirror multilayer film is obtained in advance, the extent of damage of the multilayer film of the EUV collector mirror can be estimated from the result of the measurement by means of the QCM.

The ion detector 32 is constituted by a Faraday cup, for example. The multilayer film mirror 33 is formed with a multilayer film of molybdenum and silicon having a high reflectance for the light having a wavelength of about 13.5 nm, for example. The EUV photodetector 34 is constituted of a zirconium (Zr) filter and a photo diode, for example.

In the present embodiment, a $CO_2$ laser that can generate light having a comparatively long wavelength is generally used as the driver laser 13. Further, as the target material 1, liquid xenon (Xe), solid tin (Sn), or solid lithium (Li) is used.

As previously stated, the EUV light source apparatus focuses the laser beam at the target material to generate high density plasma. The EUV light emitted from the high density plasma is collected by the EUV collector mirror and sent to the intermediate focusing point. At that time, the ions and the neutral particles are accelerated from the high density plasma generated of the target material, and emitted as fast debris. Since the energy of the accelerated ions reaches ten and several keV, when the fast ions collide with the structural member within the vacuum chamber, many particles are emitted out from the structural member. If those particles adhere to the surface of the EUV collector mirror, the reflectance thereof will be degraded. In the present application, the structural member represents at least one of the collector mirror holder, the target supply unit, the target collecting unit, and a lens holder, which are arranged in the vacuum chamber, and the inner wall of the vacuum chamber.

Figure 2:
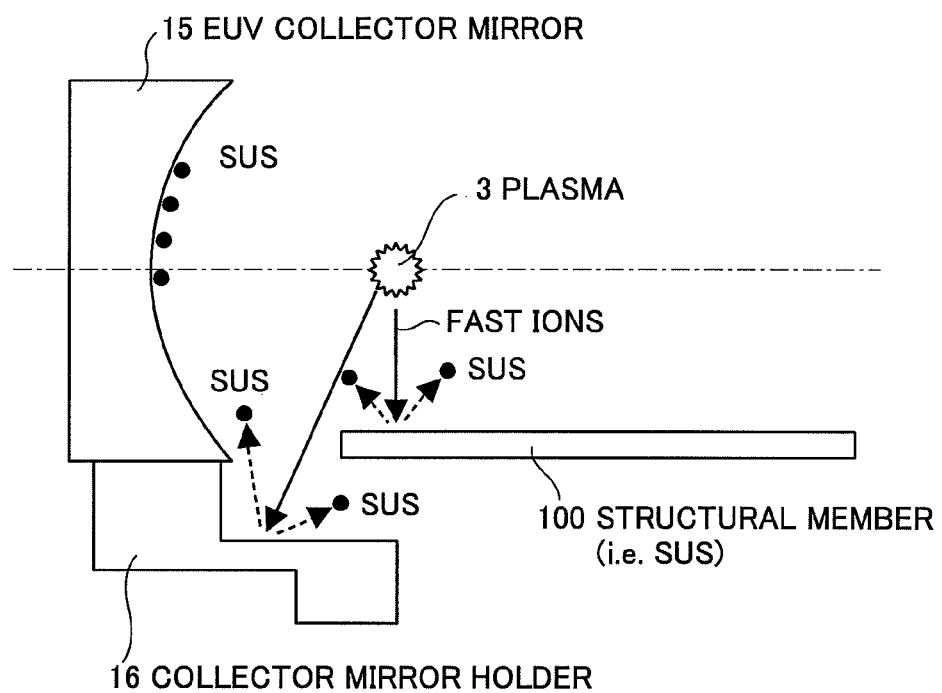
FIG. 2 is a schematic diagram conceptually illustrating a process in which particles emitted due to collision adhere to a surface of an EUV collector mirror.

FIG. 2 is a schematic diagram conceptually illustrating a process in which the fast ions collide with the structural member within the vacuum chamber and the particles emitted from the structural member due to the collision adhere to the surface of the EUV collector mirror. In FIG. 2, and in FIG. 5 etc. described later, one of the structural members other than the collector mirror holder is shown generally as a structural member 100. As illustrated in FIG. 2, the fast ions collide with the collector mirror holder 16 or the structural member 100, and the particles of atom level are emitted out from the collector mirror holder 16 or the structural member 100 due to the collision.

In the case where the structural member is made of stainless steel, the particles including iron (Fe), nickel (Ni), chromium (Cr), or the like, is emitted out. The particles move within the vacuum chamber, and some of them adhere to the EUV collector mirror 15. In that case, if the EUV light transmittance of the atoms constituting the adhering particles is low, the reflectance of the EUV collector mirror 15 will be abruptly degraded. For example, in the case where iron (Fe) is deposited by 10 nm on the surface of the EUV collector mirror 15, the reflectance thereof will be degraded from about 60% to about 23%. That is, in the case where iron (Fe) is deposited by 10 nm, because the transmittance at the time of the EUV light going and coming back through the iron layer is 38%, the reflectance of the EUV collector mirror 15 will be about 23% (0.6×0.38=0.228) after iron (Fe) having been deposited thereon.

In the present embodiment, in order to prevent the reflectance of the EUV collector mirror 15 from being degraded due to the deposition of the material constituting the structural member within the chamber, the structural member in the chamber is to be shielded by the material having a high transmittance for the EUV light. When the surface of the structural member in the chamber is shielded with the material having a high transmittance for the EUV light, even if the fast ions collide with the structural member in the chamber, the particles made of the material having a high transmittance for the EUV light are emitted out. Therefore, even if the particles deposit on the reflection surface of the EUV collector mirror 15, the degradation in the reflectance of the EUV collector mirror 15 can be suppressed.

As the material having a high transmittance for the EUV light, silicon (Si), zirconium (Zr), molybdenum (Mo), lithium (Li), aluminum (Al), or an alloy including at least one of the above-mentioned elements may be used. In the case where the thickness is 10 nm×2 (in a to-and-fro path), the transmittances for the EUV light are 96.6% for silicon (Si), 93.3% for zirconium (Zr), 88.5% for molybdenum (Mo), 81.7% for lithium (Li), and 57.6% for aluminum (Al). These transmittance values are quite large as compared with 38% of the iron (Fe). By shielding the structural member in the vacuum chamber with the shielding member made of the material having a higher transmittance for the EUV light enables to suppress the degradation of the reflectance of the EUV collector mirror.

Figure 3:
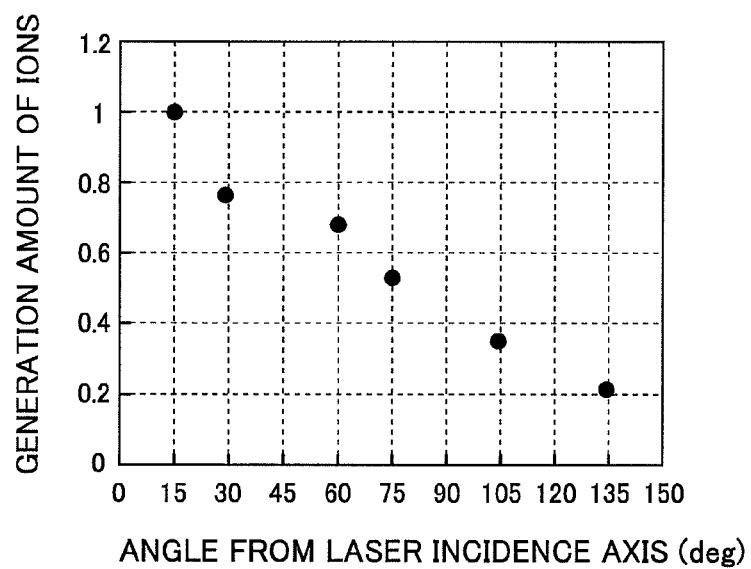
FIG. 3 illustrates angular dependence of a generation amount of fast ions emitted from plasma.

FIG. 3 illustrates angular dependence of a generation amount of fast ions emitted from plasma 3. The horizontal axis indicates an angle from a laser incidence axis, and the vertical axis indicates of a generation amount of ions (arbitrary unit). FIG. 3 shows that the generation amount of the fast ions emitted from the plasma 3 becomes larger, as the emission direction becomes closer to the direction of the laser incidence axis. As a tendency, the energy of ions becomes higher as the emission direction becomes closer to the direction of the laser incidence axis, and becomes lower as the emission direction becomes farther from the direction of the laser incidence axis.

Figure 4A:
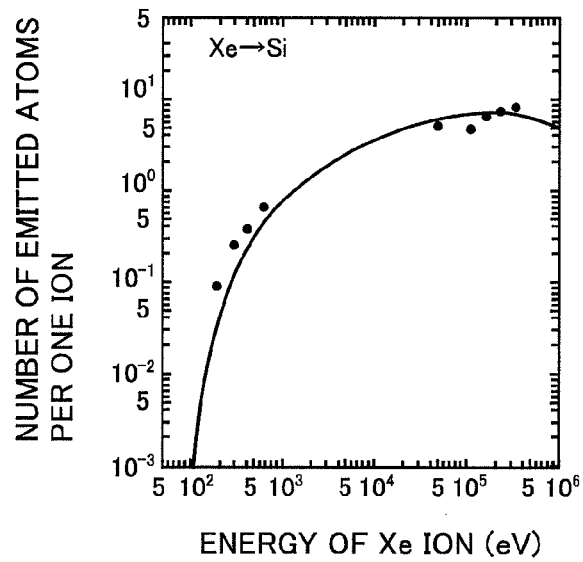
FIGS. 4A and 4B illustrate sputter rates of silicon and gold by xenon ions, respectively.
Figure 4B:
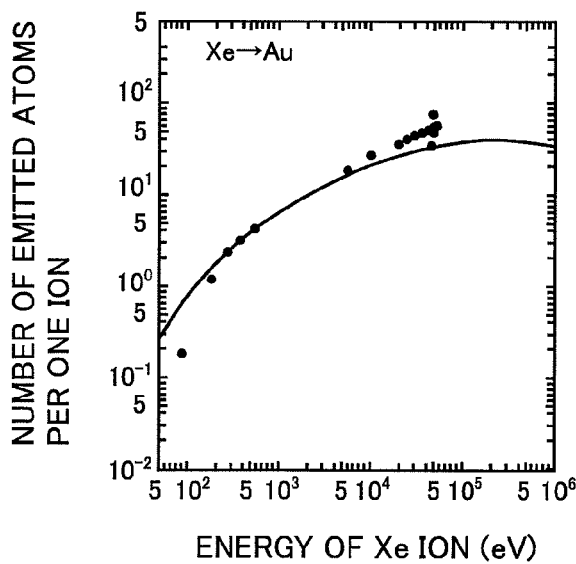

The fast ions as described above, after being emitted from the plasma 3, collide against the structural member in the chamber, and scatter the material constituting the structural member. In the present application, the degree of the scattering is referred to as "sputter rate". The sputter rate has characteristics illustrated in FIGS. 4A and 4B, for example. In FIGS. 4A and 4B, the horizontal axis indicates energy of a xenon (Xe) ion, and the vertical axis indicates number of atoms of silicon (Si) and gold (Au) respectively emitted out per one ion of xenon (Xe).

FIG. 4A illustrates the sputter rate of silicon (Si) by xenon (Xe) ions. When the energy of xenon (Xe) ion becomes larger than 100 eV, the atoms of silicon (Si) will be sputtered by xenon (Xe). In other words, if the energy of the xenon (Xe) ion is equal to 100 eV or less, it means that silicon (Si) is not easily sputtered, and a threshold value exists in the sputtering. On the other hand, FIG. 4B illustrates the sputter rate of the gold (Au) by xenon (Xe) ions. It turns out that gold (Au) is sputtered even though the energy of xenon (Xe) ion is low.

The scope of the present invention is determined based on the variation in a generation amount of ions according to the angle from the laser incidence axis, the distance between the plasma 3 emitting the fast ions and the structural member, and the sputter rate of the material constituting the structural member in the chamber. That is, the feature of the present invention is to shield the structural member existing in the area in which the collision occurs with the fast ions having energy exceeding the threshold value of the sputter rate of the structural member in the chamber, by employing the material such as silicon (Si) having a high transmittance for the EUV light. Thereby, even if the fast ions collide with the structural member, the particles including the material having a high transmittance for the EUV light deposit on the surface of the EUV collector mirror 15, and therefore, the EUV collector mirror 15 can extend its life as compared with the case of no shield. Furthermore, the surface area of the structural member, with which the fast ions collide, may be taken into consideration.

Next, a second embodiment of the present invention will be described.

Figure 5:
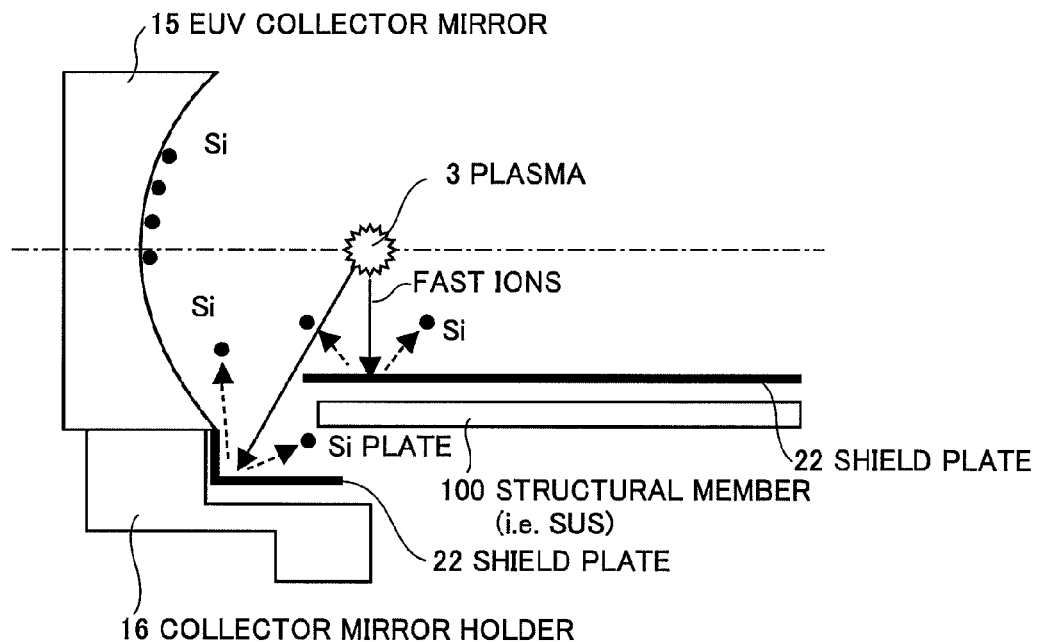
FIG. 5 is a schematic diagram illustrating an internal structure of an EUV light source apparatus according to a second embodiment of the present invention.
Figure 6:
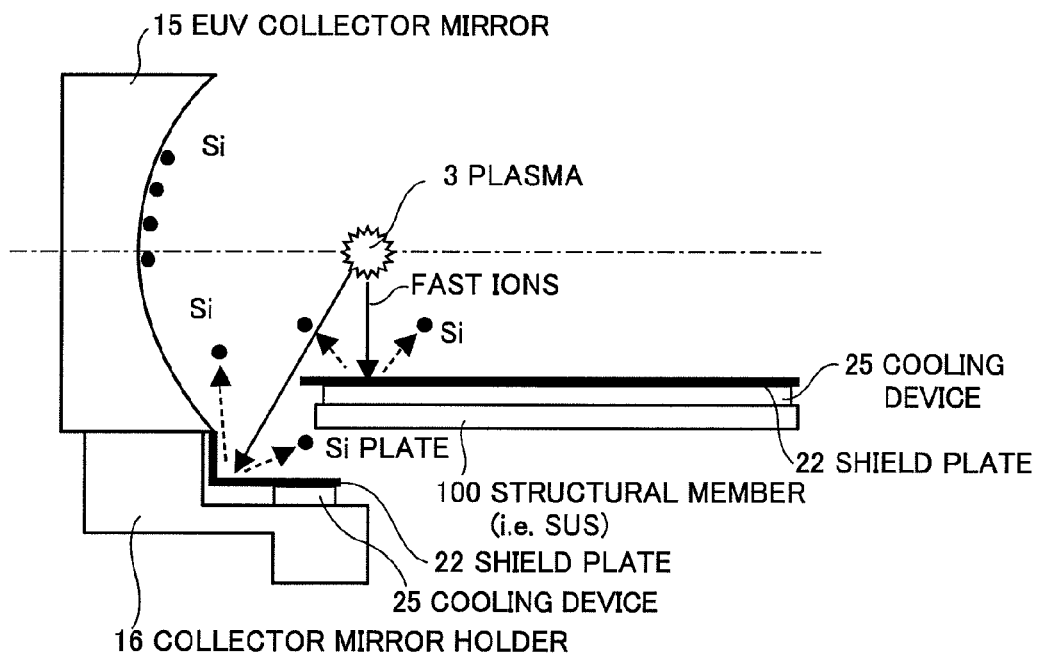
FIG. 6 is a schematic diagram illustrating a modification of the EUV light source apparatus according to the second embodiment of the present invention.

FIG. 5 is a schematic diagram illustrating an internal structure of an EUV light source apparatus according to the second embodiment of the present invention that covers the structural member by employing a plates made of the material having a high transmittance for the EUV light as the shielding member. FIG. 6 is a schematic diagram illustrating a modification of the EUV light source apparatus according to the second embodiment of the present invention.

The EUV light source apparatus according to the present embodiment is provided with shield plates 22 made of the material having a high transmittance for the EUV light in order to cover the collector mirror holder 16 and structural member 100 which are exposed to the plasma in the vacuum chamber as illustrated in FIG. 5. In the present embodiment, as the material of the shield plate 22, the silicon (Si) having a high transmittance for the EUV light is used. However, zirconium (Zr), molybdenum (Mo), lithium (Li), aluminum (Al), or an alloy including at least one of them may be used.

For providing the shield plate 22, if a gap is formed between the structural member 100 and the shield plate 22, heat dissipation from the shield plate 22 becomes difficult in the vacuum environment to cause a problem that temperature of the shield plate 22 rises up. In order to solve the problem, adhesion may be enhanced between the structural member 100 and the shield plate 22 for the heat to dissipate from the shield plate 22 to the structural member 100. In order to enhance the adhesion, a material excellent in heat conduction, such as indium (In), may be inserted and fixed between the structural member 100 and the shield plate 22. As illustrated in FIG. 6, a cooling device 25 may be provided between the collector mirror holder 16 or structural member 100 and the shield plate 22.

In the present embodiment, silicon (Si) is used as the material having a high transmittance for the EUV light. However, the collector mirror holder 16 and the structural member 100 arranged in the vacuum chamber are made of stainless steel in many cases, and the structural member itself has a complicated shape in many cases. On the other hand, silicon (Si) has the feature that it breaks easily, processing such as bending is impossible, and it is inferior in workability. Therefore, it may be difficult for silicon (Si) to cover the structural member having complicated shapes by processing the silicon as a plate. Then, a third embodiment described in the following is an embodiment noticing workability of the material.

Figure 7:
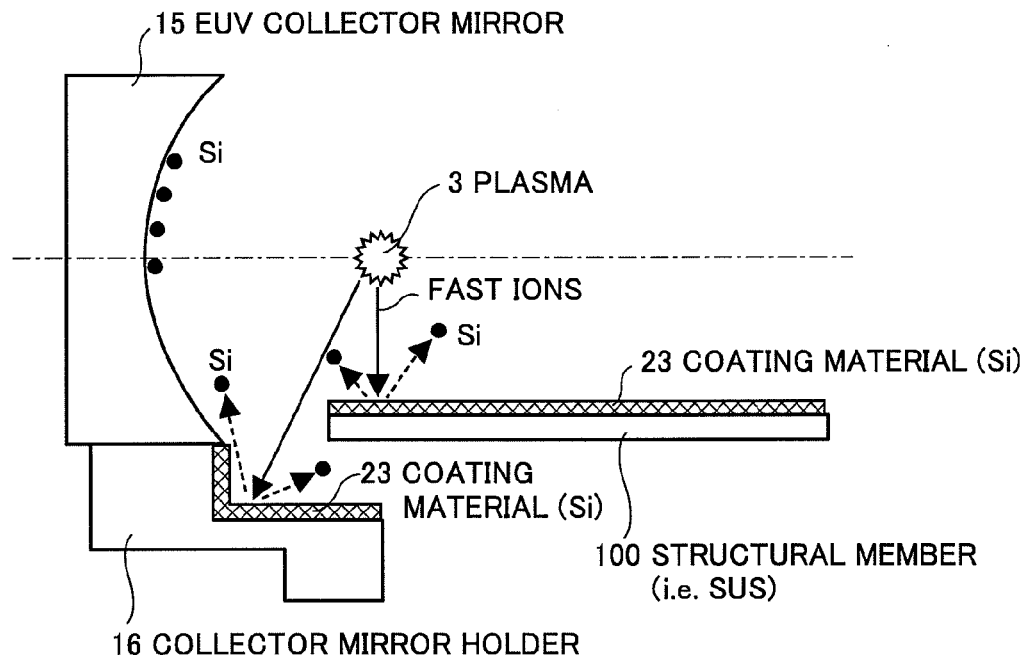
FIG. 7 is a schematic diagram illustrating an internal structure of an EUV light source apparatus according to a third embodiment of the present invention.

FIG. 7 is a schematic diagram illustrating an internal structure of an EUV light source apparatus according to the third embodiment of the present invention that provides a shielding member by coating the structural member with coating material having a high transmittance for the EUV light. In the third embodiment, a coating material 23 is formed by coating at least a part of the collector mirror holder 16 and the structural member 100 arranged in the vacuum chamber with silicon (Si) as the material having a high transmittance for the EUV light. As a coating method, chemical vapor deposition (CVD), detonation flame spraying, and so on may be used. As a coating material, as well as silicon (Si), zirconium (Zr), molybdenum (Mo), lithium (Li), aluminum (Al), or an alloy including at least one of them may be used. Since the adhesion between the coating material 23 and the collector mirror holder 16 or the structural member 100 is maintained, if the collector mirror holder 16 or the structural member 100 is cooled, the coating material 23 can be prevented from temperature rise.

Figure 8:
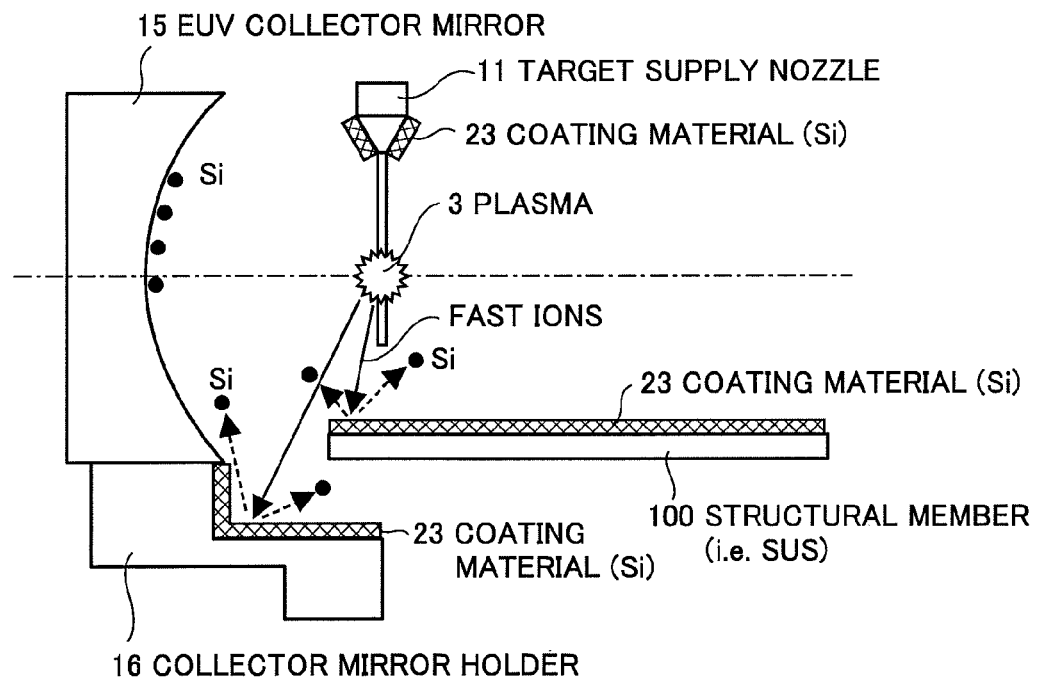
FIG. 8 is a schematic diagram illustrating an internal structure of an EUV light source apparatus according to a fourth embodiment of the present invention.

FIG. 8 is a schematic diagram illustrating an internal structure of an EUV light source apparatus according to a fourth embodiment of the present invention in which at least a part of the target supply nozzle is coated. In the fourth embodiment, the coating material 23 is formed by coating at least apart of the target supply nozzle 11 with silicon (Si), for example, as the material having a high transmittance for the EUV light. The target supply nozzle 11 is generally arranged in a close position to the plasma 3 in many cases. The distance between the target supply nozzle 11 and the plasma 3 is about 15 cm, for example. Since the tip of the target supply nozzle 11 is easy to be sputtered by the fast ions colliding therewith, the tip thereof is coated with the material having a high transmittance for the EUV light. Here, although the case of using the liquid target has been described, the solid target may be used. Unit for supplying liquid targets or solid targets in the vacuum chamber is referred to as a target supply unit.

Figure 9:
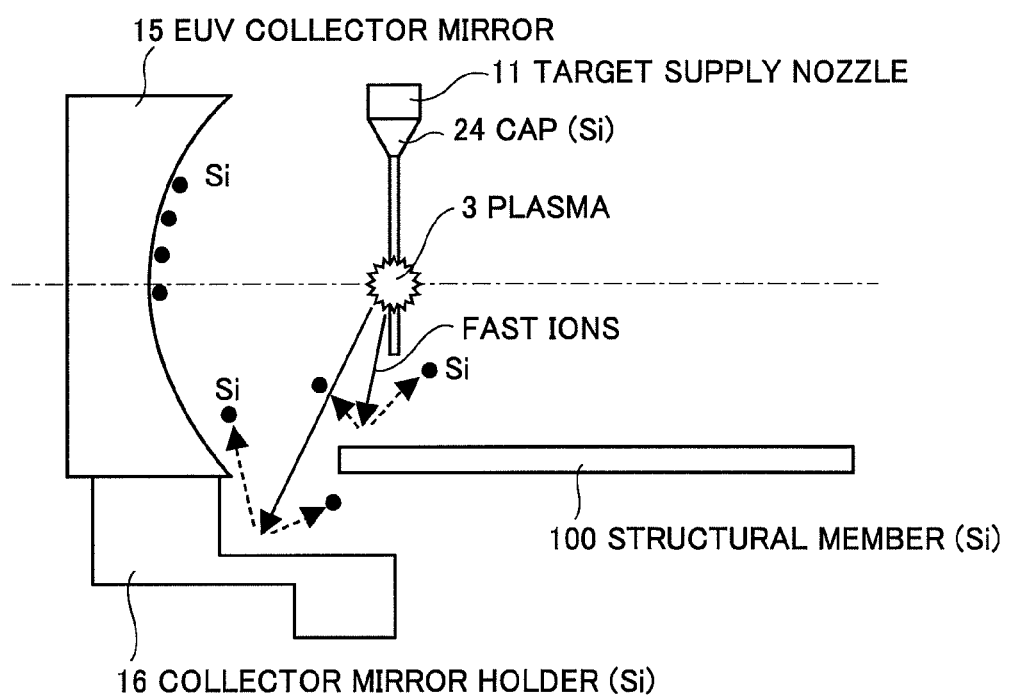
FIG. 9 is a schematic diagram illustrating an internal structure of an EUV light source apparatus according to a fifth embodiment of the present invention.

FIG. 9 is a schematic diagram illustrating an internal structure of an EUV light source apparatus according to a fifth embodiment of the present invention in which at least a part of the structural member is formed of the material having a high transmittance for the EUV light. In the fifth embodiment, at least a part of the structural member 100 existing in the area which the fast ions reach in the vacuum chamber is made of the material having a high transmittance for the EUV light. Since the structural member itself is made of the material having a high transmittance for the EUV light, even in the case where the fast ions collide with the surface of the structural member 100, only the particles having a high transmittance for the EUV light will be emitted out. Though silicon (Si) is used as the material having a high transmittance for the EUV light in the present embodiment, zirconium (Zr), molybdenum (Mo), lithium (Li), aluminum (Al), or an alloy including at least one of them may be used. FIG. 9 illustrates, as an example, the case where a cap 24 made of silicon (Si) is provided at the tip of the target supply nozzle 11, and the collector mirror holder 16 and the structural member 100 themselves are made of silicon (Si).

FIG. 10 is a conceptual side view illustrating an EUV light source apparatus according to a sixth embodiment of the present invention in which the lens holder is shielded with the material having a high transmittance for the EUV light. In the sixth embodiment, as illustrated in FIG. 10, a lens 141, which constitutes the laser beam focusing optics 14, and a lens holder 142 are arranged in the vacuum chamber 8. In order to shield the lens holder 142 from the fast ions emitted from the plasma 3, a shielding member 21 is provided. In the present embodiment, the shielding member 21 is a shield plate made of the material having a high transmittance for the EUV light. Alternatively, at least a part of the lens holder 142 may be coated with the material having a high transmittance for the EUV light. Further, at least a part of the lens holder 142 may be made of the material having a high transmittance for the EUV light.

Figure 11:
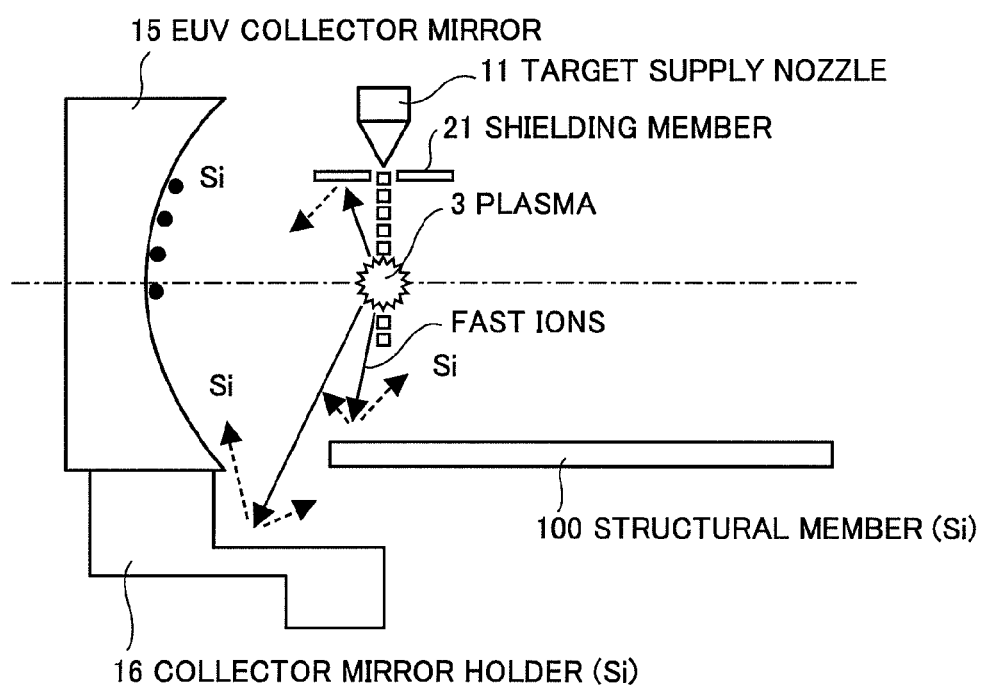
FIG. 11 is a schematic diagram illustrating an internal structure of an EUV light source apparatus according to a seventh embodiment of the present invention.

FIG. 11 is a schematic diagram illustrating an internal structure of an EUV light source apparatus according to a seventh embodiment of the present invention. The EUV light source apparatus according to the present embodiment has the target supply nozzle 11 exposed in the vacuum chamber shielded with the material having a high transmittance for the EUV light. As illustrated in FIG. 11, the collector mirror holder 16 and the structural member 100 existing in the vacuum chamber are made of silicon (Si), or are protected by silicon (Si). Furthermore, in the present embodiment, in order to protect a part of the target supply nozzle 11 facing the plasma 3, there is provided a shielding member 21 made of the material having a high transmittance for the EUV light, for example, silicon (Si) that is used in a film of the EUV collector mirror 15. The shielding member 21 located in the above-mentioned position prevents the target supply nozzle 11 from being irradiated with debris of ions and neutral particles, and at the same time, reduces influence of radiation heat from the plasma 3 on the target supply nozzle 11.

Although the shielding member 21 is made of silicon (Si) in the present embodiment, the present invention is not limited to this material, and molybdenum (Mo), which is one of the materials included in the film of the EUV collector mirror, and other proper materials such as zirconium (Zr), lithium (Li), aluminum (Al), an alloy including at least one of them, or the like having a high transmittance for the EUV light can be used. A cooling pipe attached additionally to the shielding member 21 may prevent the shielding member 21 from temperature rise.

Figure 12:
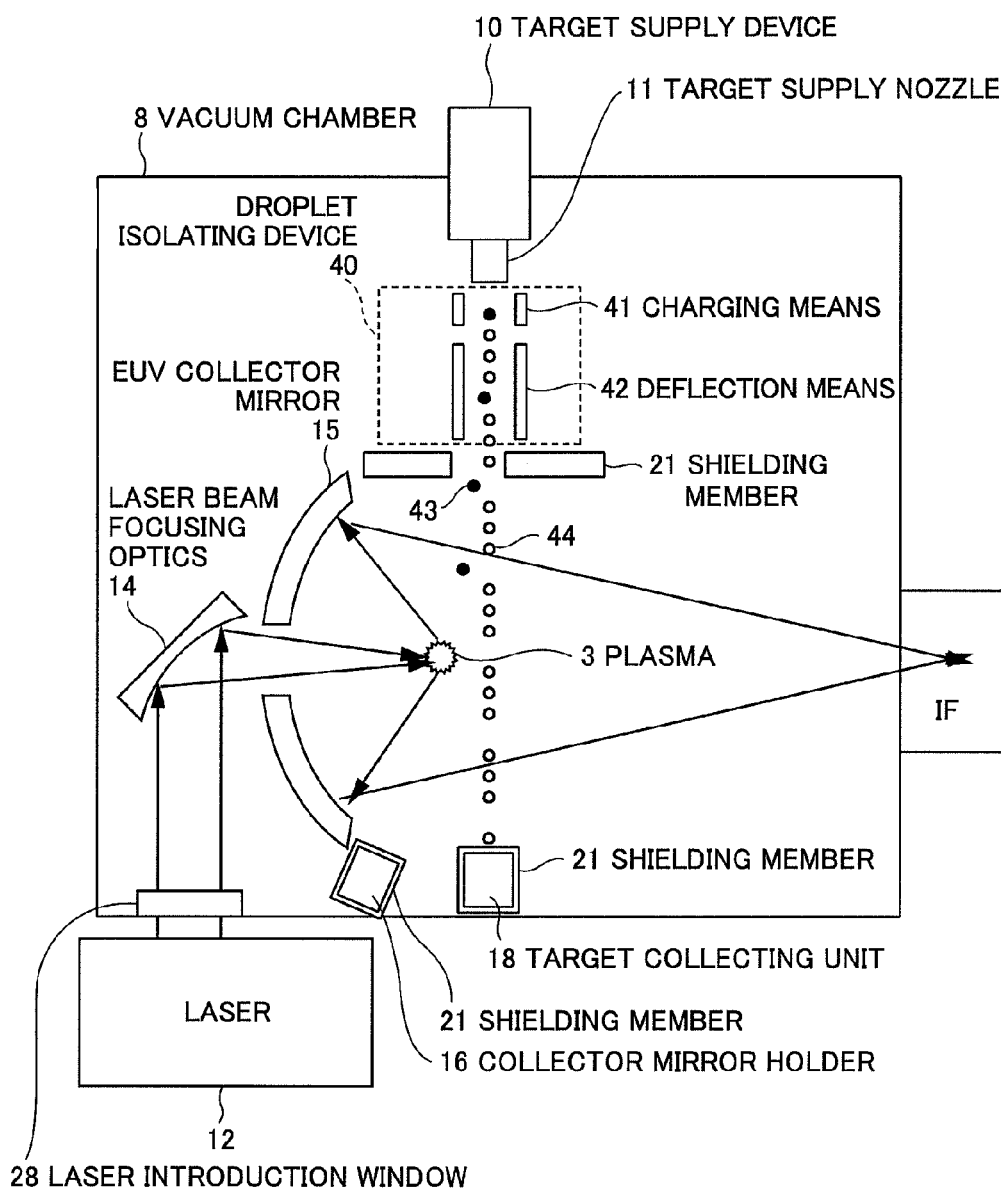
FIG. 12 is a conceptual side view illustrating an EUV light source apparatus according to an eighth embodiment of the present invention.

FIG. 12 is a conceptual side view illustrating an EUV light source apparatus according to an eighth embodiment of the present invention. The EUV light source apparatus according to the embodiment has a droplet isolating device in the vacuum chamber, and the droplet isolating device is shielded with the material having a high transmittance for the EUV light.

A frequency, "f" in which droplets of the target material are generated is not necessarily identical to a repetition operating frequency "f'" in which a laser 12 generates a pulse laser beam by the pulse oscillation. For example, the repetition operating frequency "f'" of the laser generally to be used in the LPP type EUV light source apparatus is about 10 kHz. In contrast to this, in the case of forming the droplets about 60 µm in diameter dropping at a speed of about 30 m/s, the frequency "f" of the oscillation for generating the droplets will be about 200 kHz. As described above, typically, the generating frequency "f" of the droplets will be several times to several tens of times the repetition frequency "f'". In that case, the laser beam is applied to the droplets generated from the target material injected from the target supply nozzle 11 at intervals of several droplets to several tens of droplets. Accordingly, droplets of the target material to which no laser beam has been applied, enter around the EUV collector mirror 15, and such a condition is not preferable in view of debris generation. That is, the plasma 3 is generated by applying the laser beam to certain droplets, and the adjacent droplets are evaporated by thermal energy generated thereby. Accordingly, the adjacent droplets will cause contamination within the vacuum chamber 8 though the droplets do not contribute to generation of the EUV light.

Then, the droplet isolating device changes the traveling direction of predetermined droplets among the droplets generated from the target material injected from the target supply nozzle 11 to a different direction from the traveling direction of the other droplets. Thereby, only the droplets of which the timing coincides with the application timing of the laser beam can be brought into the plasma emission point. Further, the target collecting unit 18 is arranged on the trajectory of the droplets, which do not pass through the plasma emission point, to collect the droplets, and the collected droplets can be refined for reuse by a target circulation unit.

Thus, by isolating the droplets of the target material to be turned into the plasma and by excluding the unnecessary droplets, the amount of evaporation of the target material near the plasma emission point can be reduced. Thereby, degradation of a vacuum degree (pressure rise) within the vacuum chamber 8 can be prevented, and the contamination on the parts such as the EUV collector mirror 15 within the vacuum chamber 8 can be suppressed.

In FIG. 12, the target supply nozzle 11 belonging to the target supply device 10 is vibrated by piezoelectric element, and thereby, a jet of the target material is changed to the droplets. A droplet isolating device 40 is provided with charging means 41 and deflection means 42. The charging means 41 charges necessary droplets selectively. The deflection means 42 (for example, generator of electric field or magnetic field) deflects only the charged droplets 43. Droplets 44, which have not been charged, pass straight without being deflected, and are received by the target collecting unit 18 to be collected, and are again utilized as the target material.

Figure 13:
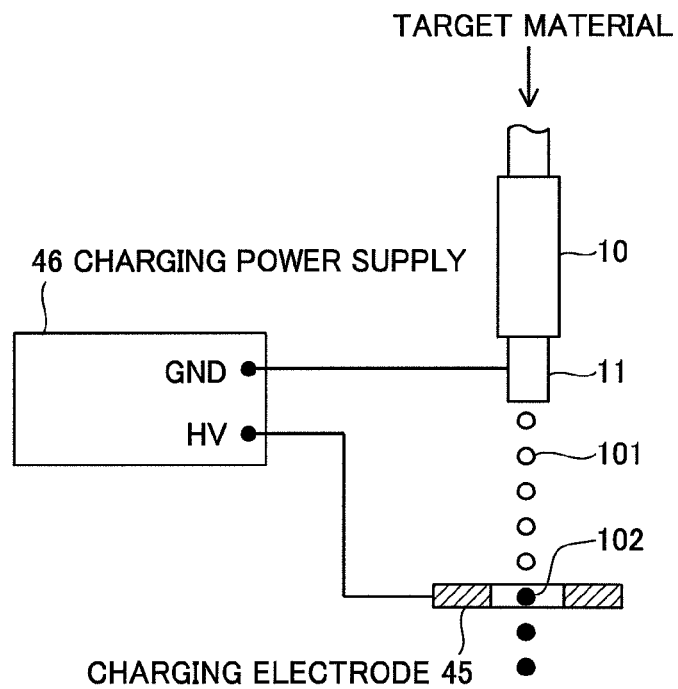
FIG. 13 is a schematic diagram illustrating a first example of configuration of charging means illustrated in FIG. 12.

FIG. 13 is a schematic diagram illustrating a first example of configuration of the charging means 41 illustrated in FIG. 12. The charging means illustrated in FIG. 13 is a charge supplying device that is suitable in the case where the target material has high conductivity. A charging electrode 45 having an opening through which droplets 101 pass formed therein is provided so as to face the target supply nozzle 11, and the target supply nozzle 11 is connected to a grounding electrode of a charging power supply 46, and a DC high voltage "HV" is supplied to the charging electrode 45. Then, electric discharge arises between the charging electrode and the conductive droplets 101 passing near the charging electrode 45, and thereby, charged droplets 102 can be obtained.

As an actual example of the target material applicable to the charging means of FIG. 13, there are water or alcohol dispersed with microscopic metal particles such as tin (Sn) and copper (Cu) or fine particles of oxides such as tin oxide ($SnO_2$), ionic solution having lithium fluoride (LiF) or lithium chloride (LiCl) dissolved in water, molten metal such as tin or lithium or the like, and so on. The target material may be liquid or may be solid at the time of the droplets being charged.

Figure 14:
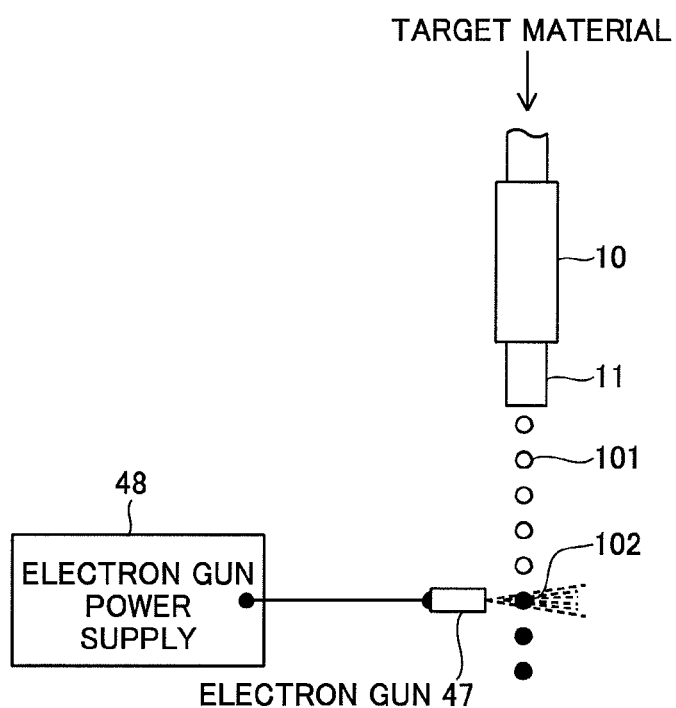
FIG. 14 is a schematic diagram illustrating a second example of configuration of the charging means illustrated in FIG. 12.

FIG. 14 is a schematic diagram illustrating a second example of configuration of the charging means 41 illustrated in FIG. 12. In the configuration, an electron gun 47 is used as the charge supplying device, and an electron gun power supply 48 controls an amount of charges.

The electron gun 47 is located such that electrons may be spouted towards the path of the droplets 101 generated from the target material injected from the target supply nozzle 11. Thereby, the droplets 101, when passing in front of the electron gun 47, are exposed to the electrons and are changed to the charged droplets 102. The electron gun power supply 48 can carry out feedback-control of the amount of charges by adjusting the output voltage according to the measurement result of the amount of charges.

The configuration of the charging means illustrated in FIG. 14 is suitable in the case where the target material has conductivity, but is applicable also in the case where the target material has low conductivity. As the target material having high conductivity, as mentioned above, there are water or alcohol dispersed with microscopic particles of metals or oxides, ionic solution dissolved with metal ions, molten metal, and so on. As the target material having low conductivity, there are rare gasses such as xenon (Xe), argon (Ar), krypton (Kr), neon (Ne), or the like, and ultra-pure water, alcohol, and so on. As also described above, the target material may be liquid or may be solid at the time of the droplets being charged.

Figure 15:
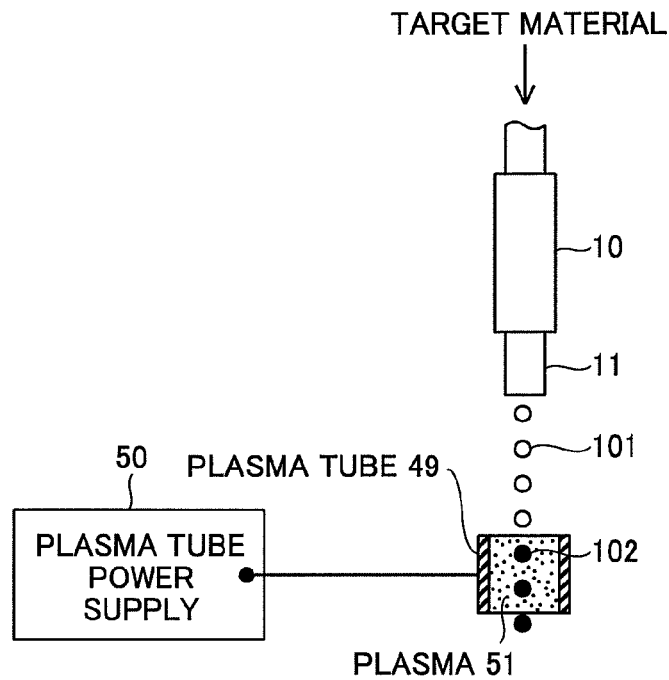
FIG. 15 is a schematic diagram illustrating a third example of configuration of the charging means illustrated in FIG. 12.

FIG. 15 is a schematic diagram illustrating a third example of configuration of the charging means 41 illustrated in FIG. 12. In the configuration, a plasma tube 49 is used as the charging means, and a plasma tube power supply 50 controls the amount of charges. The plasma tube power supply 50 supplies electrical power and plasma gas to the plasma tube 49.

The plasma tube 49 is located in the downstream side of the target supply nozzle 11, such that the droplets 101 generated from the target material injected from the target supply nozzle 11 may pass through the inside of the plasma tube. By filling up the inside of the plasma tube 49 with the plasma gas and supplying the electrical power thereto, plasma 51 is generated in the tube. Thereby, the droplets 101 are changed to the charged droplets 102 while being irradiated with the plasma 51 at the time of passing through the inside of the plasma tube 49. The plasma tube power supply 50 carries out the feedback-control of the amount of charges by adjusting the output power and the amount of the plasma gas supply according to the measurement result of the amount of charges of the droplets 102.

Figure 16:
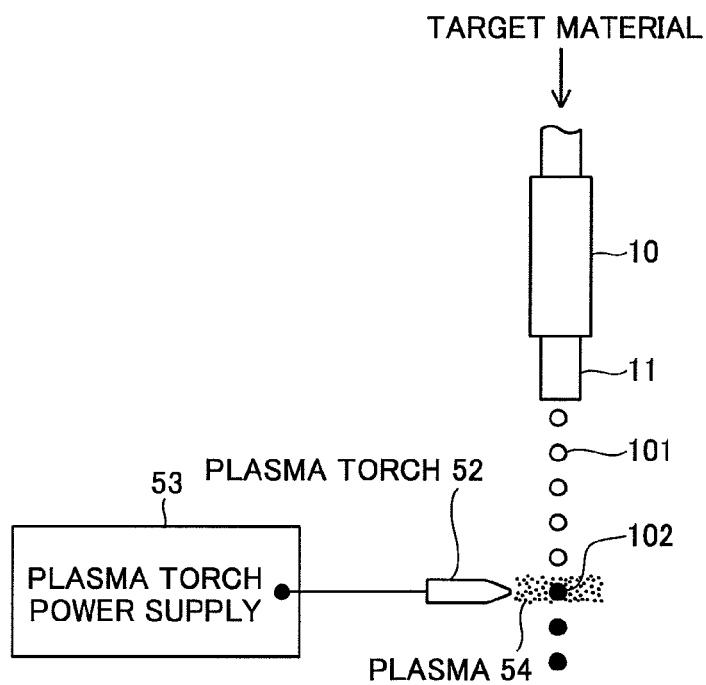
FIG. 16 is a schematic diagram illustrating a fourth example of configuration of the charging means illustrated in FIG. 12.

FIG. 16 is a schematic diagram illustrating a fourth example of configuration of the charging means 41 illustrated in FIG. 12. In the configuration, a plasma torch 52 is used as the charging means, and a plasma torch power supply 53 controls the amount of charges. The plasma torch power supply 53 supplies electrical power and plasma gas to the plasma torch 52.

The plasma torch 52 is located in the downstream of the target supply nozzle 11, such that the droplets 101 generated from the target material injected from the target supply nozzle 11 may pass through the inside of the plasma forming area. By supplying the plasma torch with the plasma gas and the electrical power, plasma 54 is generated. Thereby, the droplets 101 are irradiated with the plasma 54 during passing through the plasma forming area to be changed to charged droplets 102. The plasma torch power supply 53 can carry out feedback-control of the amount of charges by adjusting the output power and the amount of the plasma gas supply according to the measurement result of the amount of charges.

The configuration illustrated in FIGS. 15 and 16 is suitable in the case where the target material has conductivity, but is applicable also in the case where the target material has low conductivity. As the target materials having well conductivity, as mentioned above, there are the water or the alcohol dispersed with the microscopic particles of metals or oxides, the ionic solution including the metal ions, the molten metal, and so on. As the target materials having low conductivity, as mentioned above, there are the rare gasses, the ultrapure water, the alcohol, and so on. As also described above, the target material may be liquid or may be solid at the time of the droplets being charged.

Figure 17:
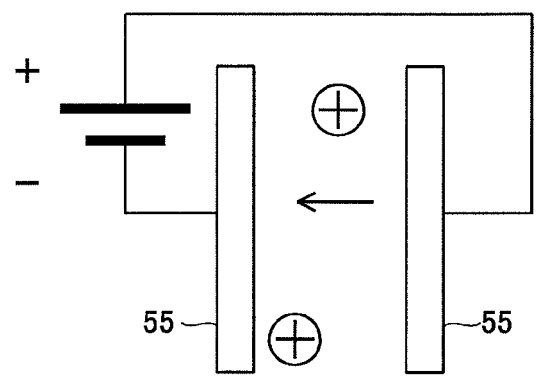
FIG. 17 is a schematic diagram illustrating a first example of configuration of deflection means illustrated in FIG. 12.

FIG. 17 is a schematic diagram illustrating a first example of configuration of the deflection means 42 illustrated in FIG. 12. The deflection means illustrated in FIG. 17 is an example of the deflection based on an electric field. In the deflection means illustrated in FIG. 17, a constant electric field is generated by applying a constant voltage between two parallel electrodes 55. When positively charged droplets pass through the electric field formed by the pair of electrodes 55, for example, the charged droplets will be deflected towards the negative electrode.

By disposing four electrodes like this and controlling the voltage, the charged droplets can be desirably deflected in the biaxial directions.

Figure 18:
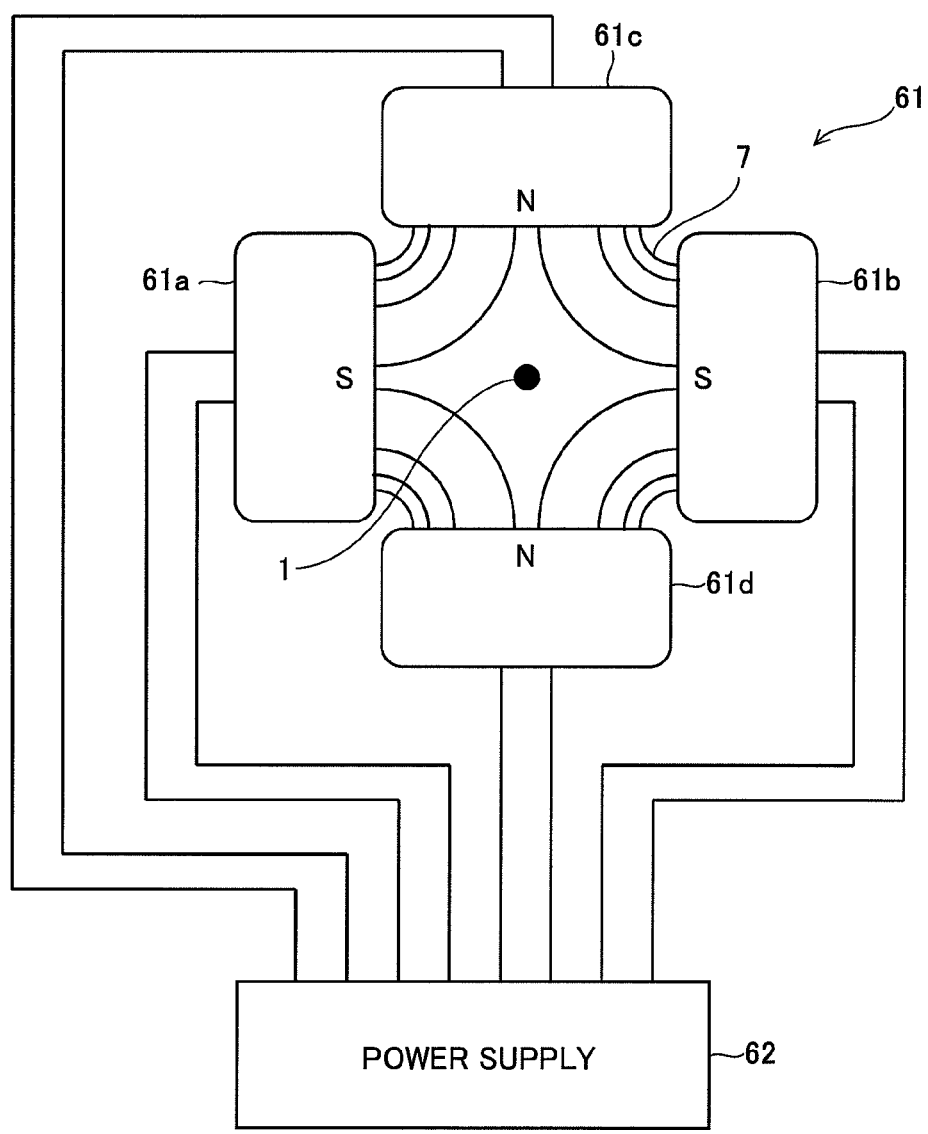
FIG. 18 is a schematic diagram illustrating a second example of configuration of the deflection means illustrated in FIG. 12.

FIG. 18 is a schematic diagram illustrating a second example of configuration of the deflection means 42 illustrated in FIG. 12. The deflection means illustrated in FIG. 18 is an example of the deflection based on a magnetic field. The deflection means includes an electromagnet part 61 and a power supply 62 that supplies a current to the electromagnet part 61. As illustrated in FIG. 18, the electromagnet part 61 includes a first pair of electromagnets 61a and 61b oppositely arranged in parallel with each other while sandwiching the trajectory of the target material in between, and a second pair of electromagnets 61c and 61d oppositely arranged in parallel with each other while sandwiching the trajectory of the target material in between. The first pair of the electromagnets 61a and 61b and the second pair of the electromagnets 61c and 61d are located mutually orthogonal. The power supply 62 supplies the current to the electromagnets 61a through 61d such that the same magnetic poles may face each other and the different magnetic poles may adjoin each other in these electromagnets 61a through 61d. Further, these electromagnets 61a through 61d are disposed such that the position, where the magnetic fields respectively formed by four electromagnets 61a through 61d are canceled at the center of the magnetic field, may exist on the axis of the plasma emission point. The magnetic field represented by magnetic flux lines 7 is formed among the four electromagnets 61a through 61d of the electromagnet part 61.

As illustrated in FIG. 18, when the droplets of the charged target material 1 pass through the center of the magnetic field formed by the electromagnet part 61 in the direction from the front side toward the rear side of the drawing, for example, the droplets cross none of the magnetic flux lines 7. Therefore, the droplets travel straight without being affected by the magnetic field. On the other hand, when the position of the droplets is deviated from the center of the magnetic field, the current formed by the charged droplets intersects the magnetic flux lines 7. Accordingly, the droplets are pushed back toward the center due to the Lorentz force. Then, as illustrated in FIG. 18, since the density of the magnetic flux lines 7 gradually increases from the center toward the circumference, as the position where the droplets pass through is closer to the circumference, the droplets cross a larger number of the magnetic flux lines 7 and are pushed back toward the center by the greater force. Consequently, the charged droplets are subject to the force in the direction toward the lower magnetic flux density (that is, toward the center of the magnetic field) and the position thereof is settled to the center of the magnetic field.

In order to adjust the center of the magnetic field formed by the electromagnetic part 61 onto the axis of the plasma emission point, intensity of each of the currents supplied to the four electromagnets 61a through 61d may be adjusted, or the position of each of the electromagnets 61a through 61d may be adjusted.

In the above description, the position of the droplet is adjusted by the effect of either the electric field or the magnetic field, however, both of the effects may be used in combination. For example, as the deflection means, the electrode pair 55 as illustrated in FIG. 17 is provided downstream of the charging means, and the electromagnet part 61 as illustrated in FIG. 18 is provided further downstream. After the trajectory of the charged droplets is adjusted by the effect of the electric field by the electrode pair 55, the trajectory of the droplets can be settled onto the axis of the plasma emission point by the effect of the magnetic field. By using the target position adjusting device utilizing the effects of both the electric field and the magnetic field, it becomes possible to adjust the position of the droplets in higher accuracy.

On the other hand, the droplets not charged by the charging means 41 go straight on without being effected by the electric field and the magnetic field, and avoid the position where the plasma 3 is generated, and are collected by the target collecting unit 18.

Thus, when the droplets are charged by any one of the charging means in FIG. 13 through FIG. 16, and a deflection direction and a deflection amount are adjusted by the deflection means in FIG. 17 or FIG. 18, the desired droplets can be separated from other droplets and supplied.

Referring to FIG. 12 again, the droplet isolating device 40 constituted as mentioned above selectively isolates only the necessary droplets 43 from other droplets 44. When the isolated droplets 43 reach the position of a first focal point of the EUV collector mirror 15, a laser beam having passed through the laser introduction window 28 is focused onto the droplets by the laser beam focusing optics 14 including a laser beam focusing mirror (off-axis parabolic mirror) etc., and thereby, the plasma 3 is generated. The EUV light emitted from the plasma 3 is selectively reflected by the EUV collector mirror 15, and is focused at the position of a second focal point (IF).

In the present embodiment, the shielding member 21 formed with an opening for the droplets to pass through is arranged between the droplet isolating device 40 and the emission point of the plasma 3. The shielding member 21 is, for example, a plate made of molybdenum (Mo) or silicon (Si), which has a high transmittance for the EUV and is used in the multilayer film of the EUV collector mirror 15, or a plate coated with molybdenum (Mo) or silicon (Si) on the surface facing the plasma 3. The shielding member 21 may be additionally provided with a cooling pipe for cooling the shielding member 21 with water. Other shielding members 21 are also provided onto the surfaces such as the surfaces of the collector mirror holder 16, the target collecting unit 18, and the various structural member arranged in the vacuum chamber 8 and facing the plasma 3.

The merits of the EUV light source apparatus according to the present embodiment are as follows:

(a) Since the shielding member 21 is located below the target supply nozzle 11 and the droplet isolating device 40, and the debris generated from the plasma 3 are blocked off, the droplet isolating device 40 and the target supply nozzle 11 are not easily damaged.

(b) Since the material of the shielding member 21 is the same as the film material of the EUV collector mirror 15, even if the surface of the shielding member 21 is sputtered with ions and the like, and the material emitted out therefrom adheres to the surface of the EUV collector mirror 15, the degradation of the reflectance is alleviated.

(c) Since the shielding member 21 blocks off the radiation from the plasma 3, the droplets become stable because the temperatures of the droplet isolating device 40 and the target supply nozzle 11 do not rise up to a high temperature.

Figure 19:
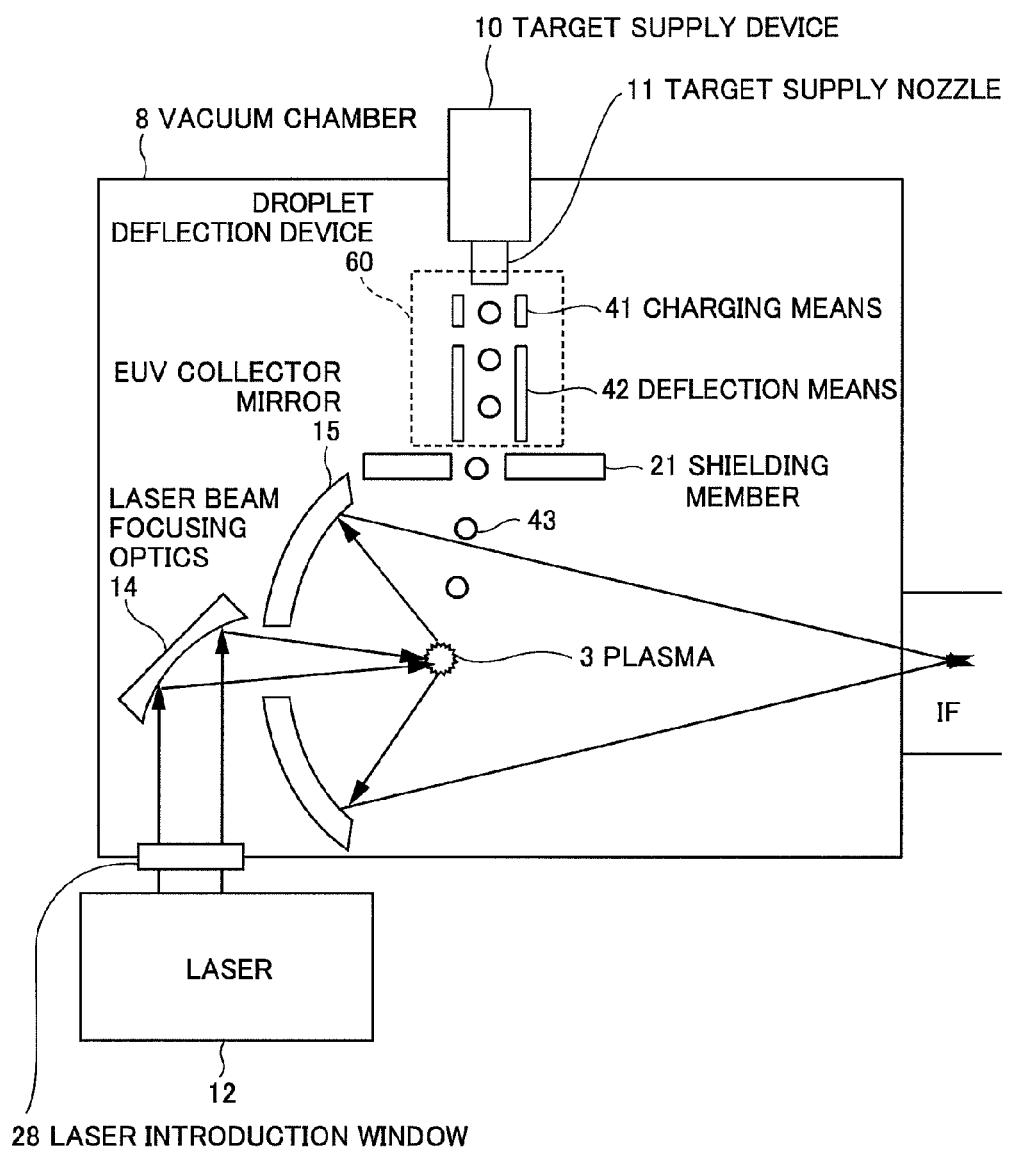
FIG. 19 is a conceptual side view illustrating an EUV light source apparatus according to a ninth embodiment of the present invention.

FIG. 19 is a conceptual side view illustrating an EUV light source apparatus according to a ninth embodiment of the present invention. The EUV light source apparatus according to the present embodiment has the droplet deflection device 60 in the vacuum chamber 8, and the droplet deflection device 60 is shielded with the material having a high transmittance for the EUV light.

The EUV light source apparatus according to the present embodiment guides the droplets generated from the target material injected from the target supply nozzle 11 of the target supply device 10 to the emission point of the plasma 3 by the droplet deflection device 60 so as to radiate the EUV light. The EUV light source apparatus is provided with a piezoelectric element for vibrating the target supply nozzle 11 to generate the droplets, and the droplet deflection device 60 having the charging means 41 and deflection means 42 and for sets the trajectory of the droplets, such that the EUV light may be acquired on demand. The charging means 41 and the deflection means 42 may be the same as those described as the eighth embodiment. However, the charging means 41 of the droplet deflection device 60 gives charges to all the droplets that pass the device.

The droplets of the target material are generated through vibrating of the target supply nozzle 11 by the piezoelectric element. The all of the generated droplets are charged by the charging means 41, and the charged droplets are deflected by the deflection means 42.

The deflection means 42 carries out deflection control of the droplets to run in the desired direction. When the droplets reaches the position of the first focal point of the EUV collector mirror 15, the laser beam outputted from the laser 12 passing through the laser introduction window 28 is focused onto the droplets at the position of the first focal point by the laser beam focusing optics 14 including the laser beam focusing mirror (off-axis parabolic mirror), and thereby, the plasma 3 emitting the light including the EUV light is generated. The EUV light emitted from the plasma 3 is selectively reflected by the EUV collector mirror 15, and is focused at the position of the second focal point (IF).

The shielding member 21 having the opening formed therein through which the droplet passes is arranged between the droplet deflection device 60 and the emission point of the plasma 3. The shielding member 21 is, for example, a plate made of molybdenum (Mo) or silicon (Si) having a high transmittance for the EUV, or a plate coated with molybdenum (Mo) or silicon (Si) on the surface facing the plasma 3. The shielding member 21 may be cooled with water. Other shielding members are also provided onto the surfaces of the collector mirror holder, the target collecting unit, and the various structural members arranged in the vacuum chamber 8 and facing the plasma 3.

The EUV light source apparatus according to the present embodiment has the same effect as the apparatus mentioned in the eighth embodiment.

Figure 20:
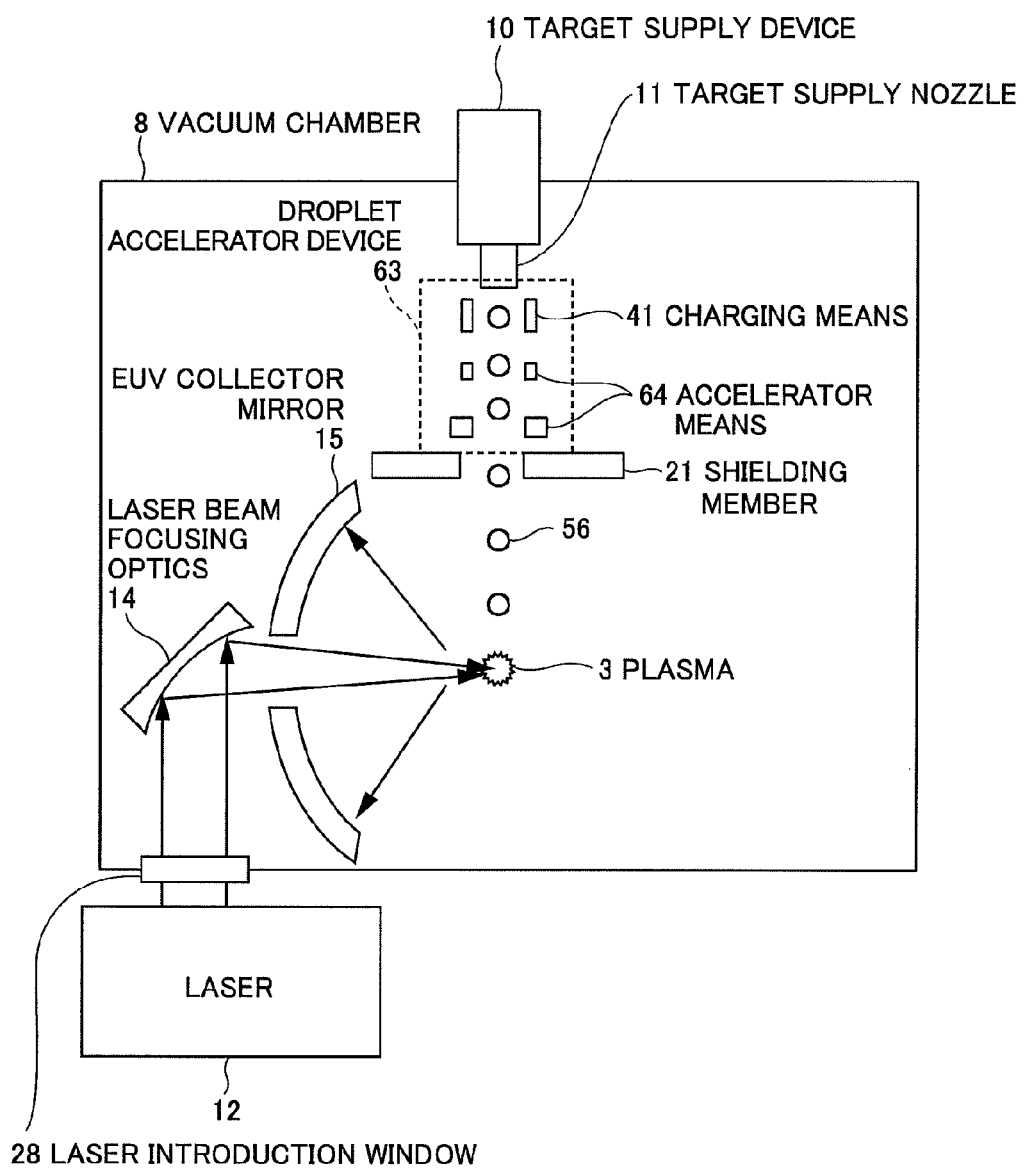
FIG. 20 is a conceptual side view illustrating an EUV light source apparatus according to a tenth embodiment of the present invention.

FIG. 20 is a conceptual side view illustrating an EUV light source apparatus according to a tenth embodiment of the present invention. The EUV light source apparatus according to the present embodiment has a droplet accelerator device 63 in the vacuum chamber 8, and the droplet accelerator device 63 is shielded from the debris.

As illustrated in FIG. 20, the EUV light source apparatus according to the present embodiment generates droplets from a target material injected from a target supply nozzle 11 by using a piezoelectric element, charges the generated droplets by using charging means 41, accelerates the droplets by using accelerator means 64 utilizing the electric field, for example, and guides the droplets into the generation position of the plasma 3, and thereby, the laser beam generated by the laser 12 is focused and applied to the droplets. In the present application, a device provided with the charging means 41 and the accelerator means 64 is referred to as the droplet accelerator device 63.

As the charging means 41, various kinds of devices such as an electron beam generator described in the eighth embodiment can be utilized. The accelerator means 64 may be an induction accelerator, or an electrostatic accelerator, or a combination thereof. For example, the electrostatic accelerator accelerates the charged target material by the effect of the electric field formed in the area through which the target material passes.

Figure 21:
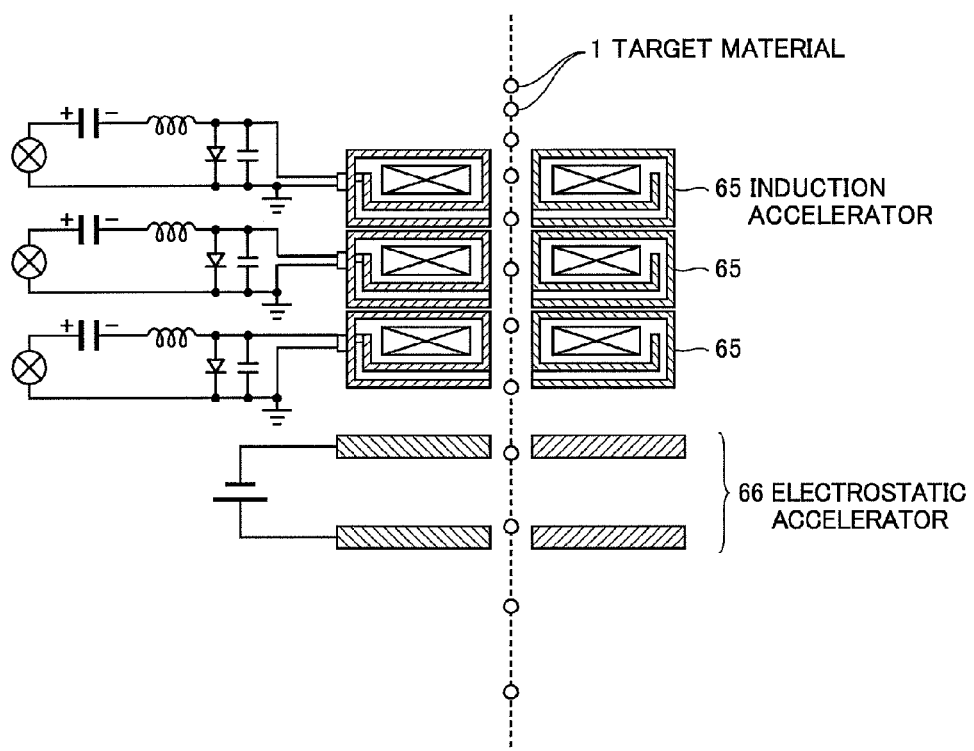
FIG. 21 is a schematic diagram illustrating an example of an accelerator applied to the EUV light source apparatus according to the tenth embodiment.

FIG. 21 is a schematic diagram illustrating an example of an accelerator applied to the EUV light source apparatus according to the tenth embodiment, in which the accelerator is formed by the combination of the induction accelerator and the electrostatic accelerator. The accelerator in FIG. 21 includes three stages of the induction accelerators 65, and the electrostatic accelerator 66. For example, in the case where the charged droplet-type target material 1 having an initial velocity of about 20 m/s is supplied, the target material 1 is accelerated to about 100 m/s by the three stages of the induction accelerators 65, and furthermore, the target material 1 is accelerated to about 1400 m/s by the electrostatic accelerator 66. Thus, a combination of plural accelerators enables to accelerate the target material 1 up to the desired velocity easily.

Referring to FIG. 20 again, an acceleration control of the droplets is carried out in the desired direction by the droplet accelerator device 63 including the charging means 41 and the accelerator means 64. When the droplets reach the position of the first focal point of the EUV collector mirror 15, the laser beam outputted from the laser 12 passing through the laser introduction window 28 is focused onto the droplets at the position of the first focal point by the laser beam focusing optics 14 including the laser beam focusing mirror (off-axis parabolic mirror), and thereby, the plasma 3 emitting the EUV light is generated. The EUV light generated in the plasma 3 is selectively reflected by the EUV collector mirror 15, and is focused at the position of the second focal point (IF).

In the present embodiment, the shielding member 21 having the opening formed therein through which the droplets pass is arranged between the droplet accelerator device 63 and the emission point of the plasma 3. The shielding member 21 is, for example, a plate made of molybdenum (Mo) or silicon (Si) having a high transmittance for the EUV, or a plate which is coated with molybdenum (Mo) or silicon (Si) on the surface facing the plasma 3. This shielding member 21 may be cooled with water. Other shielding members are also provided onto the surfaces of the collector mirror holder, the target collecting unit, and the various structural members arranged in the vacuum chamber 8 and facing the plasma 3.

The EUV light source apparatus according to the present embodiment has the same effect as the apparatus mentioned in the eighth embodiment.

Figure 22:
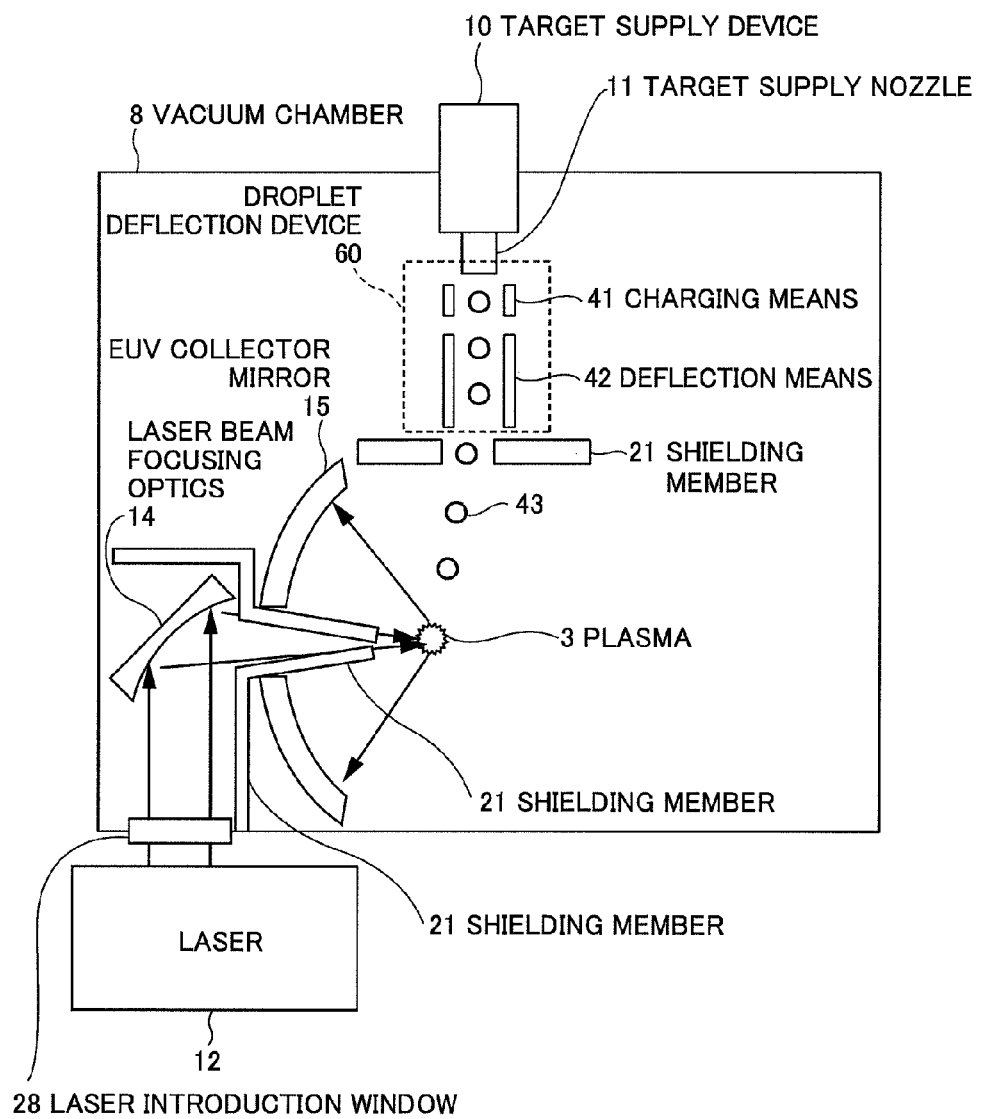
FIG. 22 is a conceptual side view illustrating an EUV light source apparatus according to an eleventh embodiment of the present invention.

FIG. 22 is a conceptual side view illustrating an EUV light source apparatus according to an eleventh embodiment of the present invention. The EUV light source apparatus according to the present embodiment is provided with a droplet deflection device 60, as an example, in a vacuum chamber 8. Further, a laser beam focusing optics including a laser beam focusing mirror arranged in the vacuum chamber is shielded from the debris by employing the material of molybdenum (Mo) or silicon (Si), in addition to the droplet deflection device 60 and the collector mirror holder.

The EUV light source apparatus according to the present embodiment differs from the EUV light source apparatus according to the ninth embodiment as illustrated in FIG. 19 in the following points:

(a) In order that the laser beam focusing mirror of the laser beam focusing optics 14 may not be damaged due to the debris from the plasma 3, a shielding member 21 made of the material of molybdenum (Mo) or silicon (Si) is arranged, or a shielding member 21 coated with a film of molybdenum (Mo) or silicon (Si) on the surface exposed to the plasma is arranged.

(b) In order that the laser-beam introduction window 28 may not be damaged due to the debris from the plasma 3, a shielding member 21 made of the material of molybdenum (Mo) or silicon (Si) is arranged, or a shielding member 21 coated with a film of molybdenum (Mo) or silicon (Si) on the surface exposed to the plasma is arranged.

The effects of the debris-shielding in the EUV light source apparatus according to the present embodiment are as follows:
(a) The laser beam focusing mirror is prevented from damage due to the debris, and prevented from degradation due to adhesion of the debris.
(b) Even if the surface of the shielding member 21 is sputtered with the ions and the like, since a material of the particles emitted by the sputtering is the same as the film material of the EUV collector mirror, the degradation of reflectance is alleviated.
(c) The radiation from the plasma 3 can be blocked off, and thereby, the thermal stability of the laser beam focusing mirror is improved and the focusing performance is stabilized.

In the embodiments described above, the examples are shown in which the EUV light is generated by applying the laser beam to the target material by using a single laser as the driver laser of the LPP type EUV light source apparatus. However, the present invention is not limited to these embodiments. For example, also in such a LPP type EUV light source apparatus which applies a main pulse laser beam to the target material after applying a pre-pulse laser beam thereto, it is preferred to arrange shielding members employing a material of molybdenum (Mo) or silicon (Si), for an introduction window of the pre-pulse laser beam and the optical elements (a mirror, a focusing mirror, a lens, etc.) disposed in the vacuum chamber 8. The shielding member may be a plate made of a material of molybdenum (Mo) or silicon (Si), or a plate coated with molybdenum (Mo) or silicon (Si) on a surface exposed to the plasma 3.

In addition to the above-mentioned embodiments, in order to perform the same function as the shielding member, deflecting electrodes, a charging electrode, or a target supply nozzle can be made of the material of molybdenum (Mo) or silicon (Si) and arranged.

Figure 23:
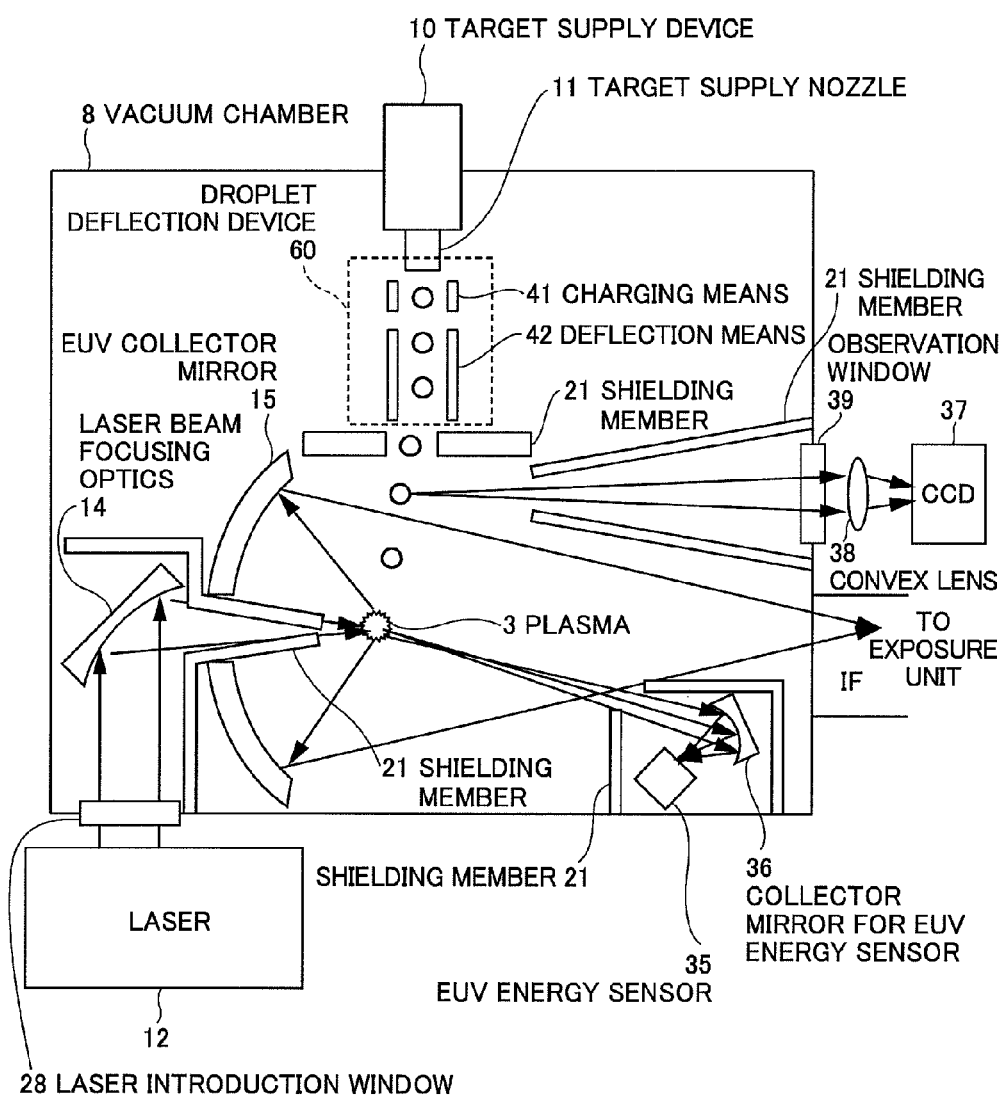
FIG. 23 is a conceptual side view illustrating an EUV light source apparatus according to a twelfth embodiment of the present invention.

FIG. 23 is a conceptual side view illustrating an EUV light source apparatus according to a twelfth embodiment of the present invention. The EUV light source apparatus according to the present embodiment is provided with a droplet deflection device 60, as an example, in a vacuum chamber 8. Further, at least one sensor arranged in the vacuum chamber 8 is shielded from debris by employing a material of molybdenum (Mo) or silicon (Si), in addition to the droplet deflection device 60, a collector mirror holder, and laser beam focusing optics including a laser beam focusing mirror.

The EUV light source apparatus according to the present embodiment differs from the EUV light source apparatus according to the eleventh embodiment illustrated in FIG. 22 in the following points:
(a) An observation window 39 for measuring the droplets is provided with a shielding member 21 made of a material of molybdenum (Mo) or silicon (Si), or a shielding member 21 coated with a film of molybdenum (Mo) or silicon (Si) on the surface exposed to the plasma 3.
(b) At least one of optical elements (a collector mirror 36 for an EUV energy sensor, and the EUV energy sensor 35) for measuring the EUV light is provided with a shielding member 21 made of a material of molybdenum (Mo) or silicon (Si), or a shielding member 21 coated with a film of molybdenum (Mo) or silicon (Si) on the surface exposed to the plasma 3.

The effects of the debris-shielding in the EUV light source apparatus according to the present embodiment are as follows:
(a) The droplets can be measured stably without damaging of the observation window and without adhering of the debris.
(b) The EUV light can be measured stably without damaging of the optical elements for the EUV measurement due to the debris.

FIG. 23 shows the shielding member 21 provided for the observation window 39 of a droplet measuring device, and the energy sensor 35 and the optical elements for the EUV energy measurement. However, the present invention is not limited to these examples. In order that the debris may not reach directly other observation windows nor other optical elements for measurement or the like disposed in the vacuum chamber 8, the shielding members made of molybdenum (Mo) or silicon (Si) can be arranged.

Figure 24:
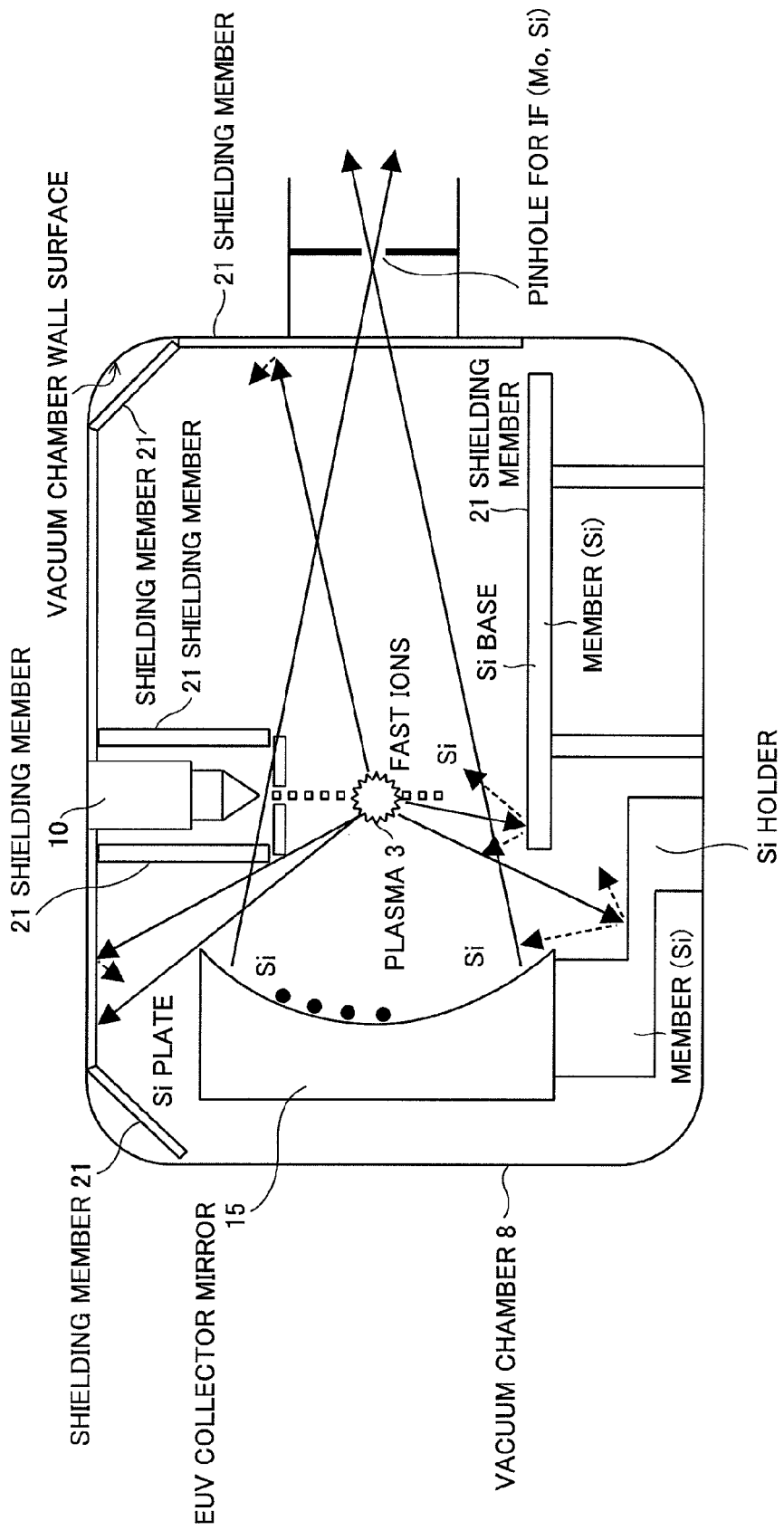
FIG. 24 is a conceptual side view illustrating an EUV light source apparatus according to a thirteenth embodiment of the present invention.

FIG. 24 is a conceptual side view illustrating an EUV light source apparatus according to a thirteenth embodiment of the present invention. The EUV light source apparatus according to the present embodiment protects, with the shielding member 21, at least one part which the debris from the plasma 3 reach within the inner wall surfaces of the vacuum chamber 8.

The EUV light source apparatus according to the present embodiment is provided with a shielding member 21 for the at least one part which the debris from the plasma 3 reach within the inner wall surfaces of the vacuum chamber 8, according to the following manners:
(a) It is necessary for the vacuum chamber 8 to be made of SUS material having high strength in order to keep a vacuum state. Therefore, the inner surfaces of the vacuum chamber 8 are sealed up with the shielding member 21 made of silicon (Si) that is more inexpensive than molybdenum (Mo).
(b) In the case where the debris reach the side surfaces of the droplet supply unit 10, most of droplet supply unit 10 may be covered with the shielding member 21.
(c) The plate formed with the IF pinhole may be made of the material of molybdenum (Mo) or silicon (Si).

The EUV light source apparatus according to the present embodiment is not limited to the example illustrated in FIG. 24, and the following may be available.
(a) The whole of inner wall surfaces of the vacuum chamber 8 may be coated with a material of molybdenum (Mo) or silicon (Si). In the case where the shielding member 21 is made of other material, the surface exposed to the plasma of the shielding member 21 may be coated with molybdenum (Mo) or silicon (Si).
(b) The shielding member 21 is disposed on the part, which the debris reach, of the component elements arranged inside of the vacuum chamber 8. The whole of shielding member 21 may be coated with the material of molybdenum (Mo) or silicon (Si), or only the side of the shielding member 21 exposed to the plasma may be coated with molybdenum (Mo) or silicon (Si).

In the EUV light source apparatus according to the present embodiment, since the shielding member 21 is arranged on the at least one part of the inner wall surfaces of the vacuum chamber 8, which the debris from the plasma 3 reach, sputtering of the SUS material (Fe, Cr, Ni, etc.) as the EUV chamber material caused by the debris is suppressed, and iron (Fe), chromium (Cr), and nickel (Ni), for example, are suppressed from depositing on the surface of the EUV collector mirror 15. Therefore, the life of the EUV collector mirror 15 lengthens.

Figure 25:
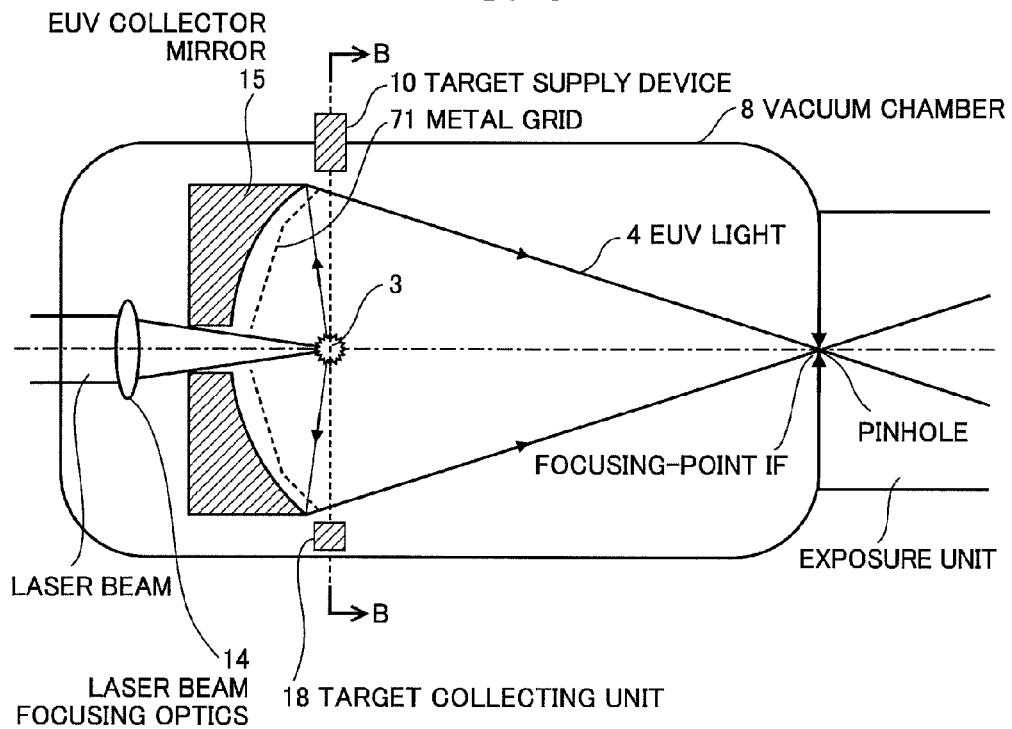
FIG. 25 is a side sectional view illustrating an EUV light source apparatus according to a fourteenth embodiment of the present invention.
Figure 26:
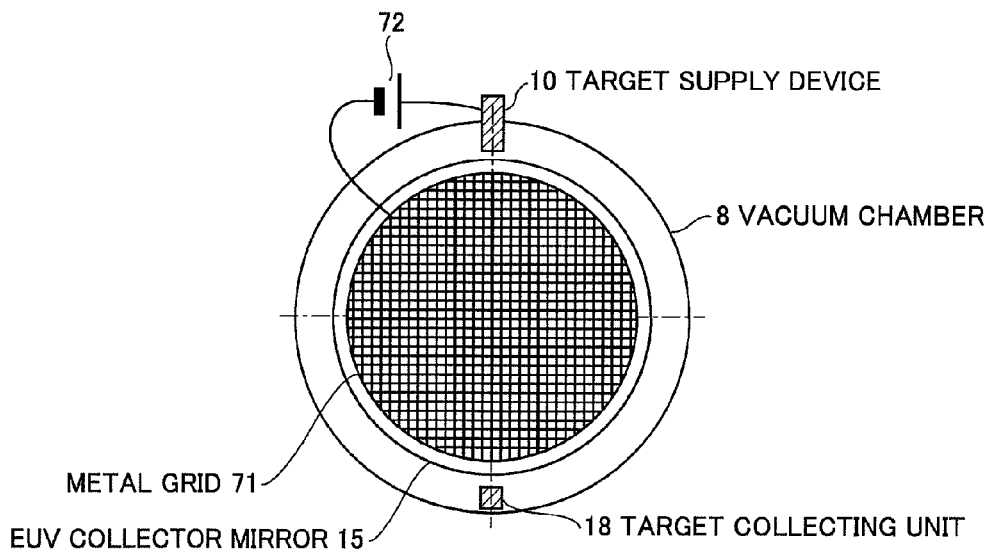
FIG. 26 is a B-B sectional view of FIG. 25.

FIG. 25 is a side sectional view illustrating an EUV light source apparatus according to a fourteenth embodiment of the present invention. FIG. 25 illustrates the EUV light source apparatus sectioned along the vertical plane including the optical axis of the EUV collector mirror 15. FIG. 26 is a B-B sectional view of FIG. 25.

The present embodiment employs a method of generating the electric field near the reflection surface of the EUV collector mirror to repel the ions emitted from the plasma 3, in order to prevent the sputtering and the deposition on the reflection surface of the EUV collector mirror 15 due to the ions.

In the EUV light source apparatus according to the present embodiment, a metal grid 71 is disposed between the EUV collector mirror 15 and the plasma emission point. By applying a positive electrical potential to the metal grid 71 from a DC power supply 72, the particles of tin (Sn) ions, for example, having positive charges are repelled at the position of the metal grid 71, and are restrained from reaching the reflection surface of the EUV collector mirror 15. By employing molybdenum (Mo) metal as a material of the metal grid 71, or by coating the surface of the metal grid 71 with silicon (Si), molybdenum (Mo) or the like, the metal emitted out from the metal grid 71 when ions collide therewith will be silicon (Si), molybdenum (Mo) or the like, which has a high transmittance for the EUV light and which is the same as the material of the multilayer film of the EUV collector mirror 15. Therefore, the degradation of the reflectance on the surface of the metal grid 71 is alleviated.

Figure 27:
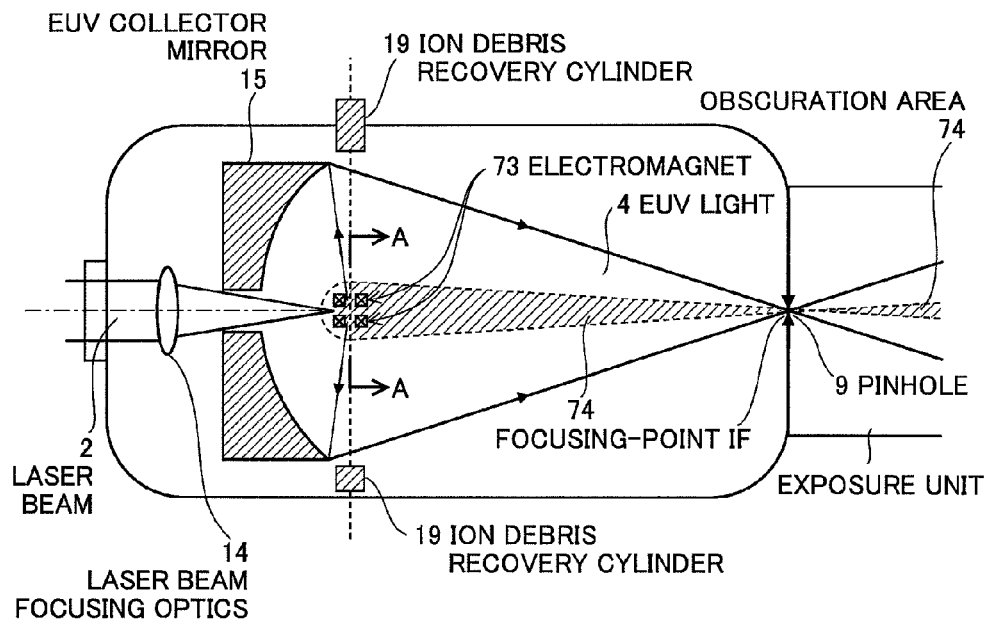
FIG. 27 is a planar sectional view illustrating an EUV light source apparatus according to a fifteenth embodiment of the present invention.
Figure 28:
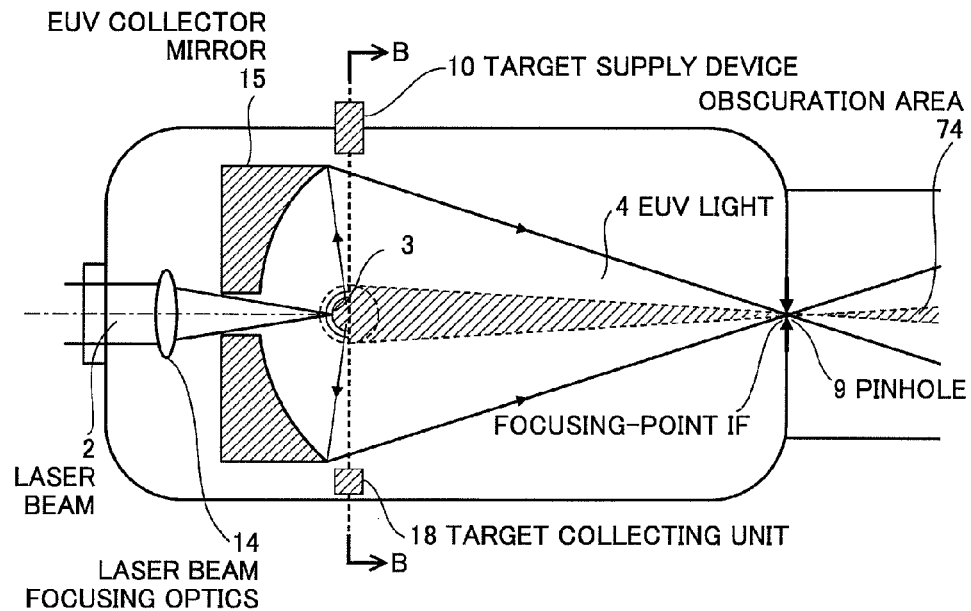
FIG. 28 is a side sectional view illustrating the EUV light source apparatus according to the fifteenth embodiment of the present invention.
Figure 29:
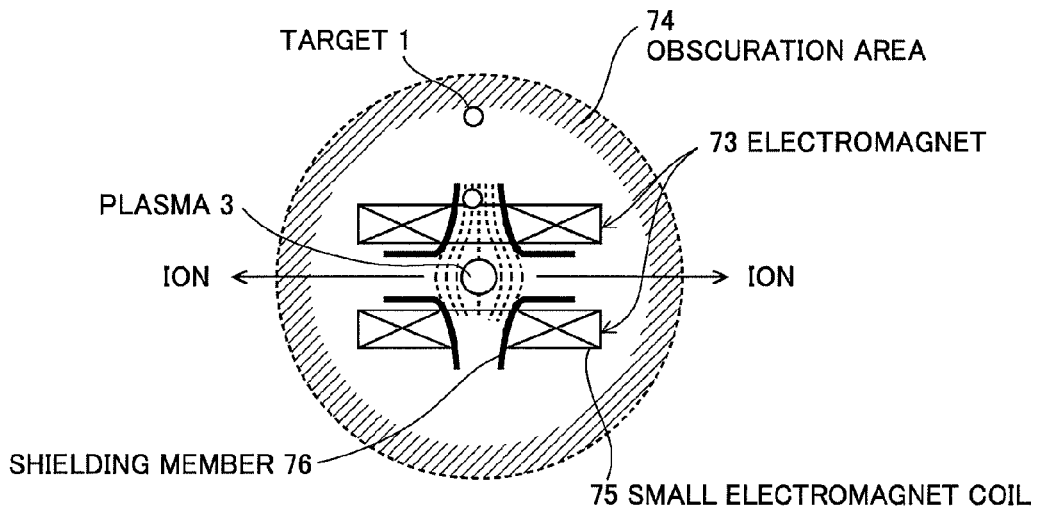
FIG. 29 is an enlarged A-A sectional view in FIG. 27.
Figure 30:
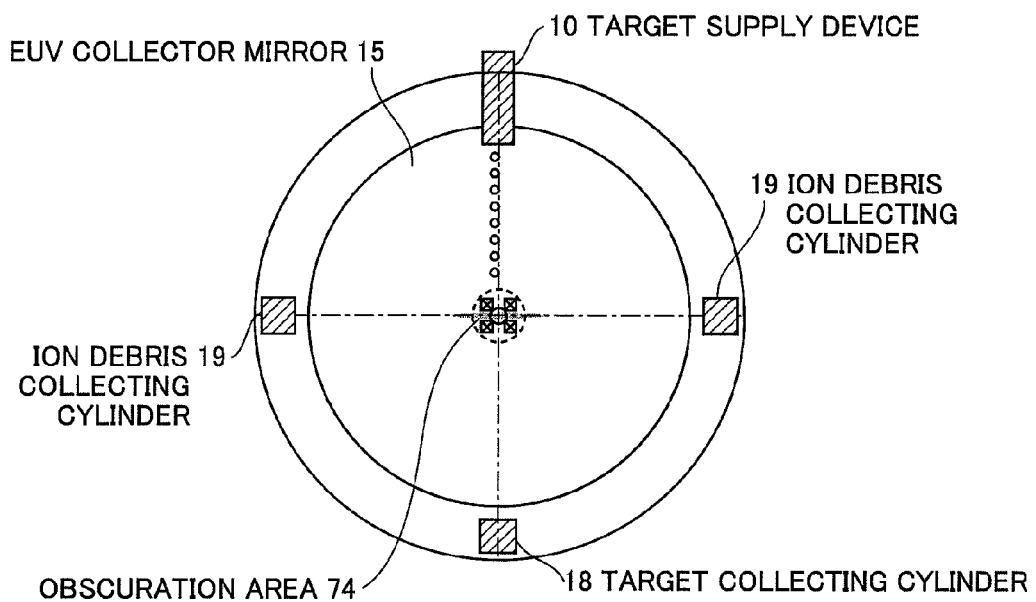
FIG. 30 is a B-B sectional view in FIG. 28.

FIGS. 27-30 illustrate an EUV light source apparatus according to a fifteenth embodiment of the present invention. FIG. 27 is a planar sectional view illustrating the EUV light source apparatus according to the fifteenth embodiment of the present invention. FIG. 28 is a side sectional view illustrating the EUV light source apparatus according to the fifteenth embodiment of the present invention. FIG. 29 is an enlarged A-A sectional view in FIG. 27, and FIG. 30 is a B-B sectional view in FIG. 28. The EUV light source apparatus according to the present embodiment guides the flow of the ions generated from the plasma 3 in the direction to the side of the EUV collector mirror 15 by the effect of the magnetic field so as to protect the reflection surface of the EUV collector mirror 15.

As illustrated in FIGS. 27-30, two small electromagnets 73 are disposed so as to surround the plasma emission point in an obscuration area 74. Here, the obscuration area is the area corresponding to the angle range in which the EUV light collected by the EUV collector mirror 15 is not utilized in the exposure unit. According to the present embodiment, the ions generated at the plasma 3 does not move in the direction to the EUV collector mirror 15 due to the effect of the local magnetic field formed in the surroundings of the plasma 3.

The small electromagnets 73 can apply the local magnetic field of several Tesla to the emission point of the plasma 3, even if they are small, because a gap of the coils 75 is several millimeters. The small electromagnets 73 are housed inside the vacuum chamber 8, and the magnetic field leak is also small. Since the flux density is abruptly reduced with distance, the magnetic field is not generated outside of the EUV light source apparatus and there exists no interference with the exposure unit.

The ion debris from the plasma 3 flows in the direction of the magnetic field generated by the small electromagnets 73, passes through bores of the coils 75 to flow outside, and is collected by ion debris collecting cylinders 19 provided in the side surface of the vacuum chamber 8. At this time, the ion debris may collide with the external wall surface of the magnetic core, and the metal of this external wall surface may be sputtered. Accordingly, as illustrated in FIG. 29, when the shielding member 76 made of the same material as the film material of the multilayer film of the EUV collector mirror 15 (for example, silicon (Si) or molybdenum (Mo)) is arranged on the surface of the magnet core, the reflectance of the EUV collector mirror 15 is not impaired largely even if the sputtered metal deposits on the surface of the EUV collector mirror 15. The shielding member 76 can be formed of a plate coated with the same material as the material of the multilayer film of the EUV collector mirror 15. Alternatively, the shielding member 76 can be formed by coating the outer wall of the magnet core with the same material as the material of the multilayer film of the EUV collector mirror 15. The shielding member 76 may exist in the area where the ions reach, or may cover the overall magnet core.

The invention claimed is:

1. An extreme ultraviolet light source apparatus for generating extreme ultraviolet light from plasma generated by irradiating a target with a laser beam, said apparatus comprising:
    a chamber in which the extreme ultraviolet light is generated;
    a target supply unit configured to supply the target into said chamber;
    a laser beam focusing mirror arranged in said chamber to focus the laser beam;
    a collector mirror having a reflection surface composed of a multilayer film and arranged in said chamber to collect and output the extreme ultraviolet light emitted from the plasma;
    a first shielding member including at least one metal selected from the group consisting of: silicon (Si), zirconium (Zr), molybdenum (Mo), lithium (Li), aluminum (Al), and an alloy including at least one of the metals, and arranged between said target supply unit and the plasma, said first shielding member being arranged apart from the reflection surface of said collector mirror;
    a second shielding member including at least one metal selected from the group consisting of: silicon (Si), zirconium (Zr), molybdenum (Mo), lithium (Li), aluminum (Al), and an allo including at least one of the metals, and arranged on an inner wall of said chamber; and
    a third shielding member including at least one metal selected from the group consisting of: silicon (Si), zirconium (Zr), molybdenum (Mo), lithium (Li), aluminum (Al), and an alloy including at least one of the metals, and arranged between said laser beam focusing mirror and the plasma.

2. The extreme ultraviolet light source apparatus according to claim 1, wherein said first shielding member includes a first shield plate formed with an opening through which the target passes.

3. The extreme ultraviolet light source apparatus according to claim 1, wherein:
    said second shielding member includes a second shield plate configured to cover the inner wall of said chamber; and
    said apparatus further comprises a cooling device arranged on said second shield plate and configured to cool said second shield plate.

4. The extreme ultraviolet light source apparatus according to claim 1, wherein at least one of said first, second, and third shielding members includes a coating.

5. The extreme ultraviolet light source apparatus according to claim 4, wherein a material of said coating is the same as a material of said multilayer film of said collector mirror.

6. The extreme ultraviolet light source apparatus according to claim 1, wherein said at least one of the inner wall of said chamber and said target supply unit includes stainless steel.

7. The extreme ultraviolet light source apparatus according to claim 1, wherein:

said target supply unit includes a charge supplying device configured to charge the target, and a deflection device configured to deflect said target charged by said charge supplying device to supply said target to a plasma emission point and said first shielding member is arranged between said deflection device and the plasma.

8. The extreme ultraviolet light source apparatus according to claim 7, wherein said charge supplying device includes any one of a discharge electrode, an electron gun, a plasma tube, and a plasma torch.

9. The extreme ultraviolet light source apparatus according to claim 7, wherein said deflection device includes:
  a first pair of electromagnets oppositely arranged in parallel with each other with a trajectory of the target in between;
  a second pair of electromagnets orthogonal to said first pair of electromagnets and oppositely arranged in parallel with each other with the trajectory of the target in between; and
  a power supply configured to supply currents to said first and second pairs of electromagnets such that the same magnetic poles face to each other and the different magnetic poles adjoin each other.

10. The extreme ultraviolet light source apparatus according to claim 1, wherein:
  said target supply unit includes a charge supplying device configured to charge said target, and an accelerator configured to accelerate said target charged by said charge supplying device to supply said target to a plasma emission point; and
  said first shielding member is arranged between said target accelerator and the plasma.

11. The extreme ultraviolet light source apparatus according to claim 1, further comprising:
  a sensor arranged outside of said chamber;
  an observation window for said sensor, said observation window being provided in said chamber; and
  a fourth shielding member including at least one metal selected from the group consisting of silicon (Si), zirconium (Zr), molybdenum (Mo), lithium (Li), aluminum (Al), and an alloy including at least one of the metals, and configured to shield said observation window from debris emitted from the plasma.

12. The extreme ultraviolet light source apparatus according to claim 1, further comprising:
  a metal grid arranged in front of the reflection surface of said collector mirror; and
  a power supply configured to induce positive potential in said metal grid to repulse ion debris.

13. The extreme ultraviolet light source apparatus according to claim 12, wherein said metal grid is formed of material having a higher transmittance for the extreme ultraviolet light than that of said at least one of the inner wall of said chamber and said target supply unit.

14. The extreme ultraviolet light source apparatus according to claim 1, further comprising:
  electromagnets arranged to surround the plasma, and configured to form a local magnetic field in surroundings of the plasma, and thereby, guide a moving direction of ions emitted from the plasma so as to divert the moving direction of ions from the reflection surface of said collector mirror.

15. The extreme ultraviolet light source apparatus according to claim 14, wherein said electromagnets are arranged in an obscuration area which corresponds to an angle range in which the extreme ultraviolet light collected by said collector mirror is not utilized in an exposure unit.

16. The extreme ultraviolet light source apparatus according to claim 1, wherein said third shielding member includes a third shield plate formed with an opening through which the laser beam passes.

* * * * *